United States Patent
Nakanishi et al.

(10) Patent No.: US 10,632,588 B2
(45) Date of Patent: Apr. 28, 2020

(54) POLISHING APPARATUS AND PRESSING PAD FOR PRESSING POLISHING TOOL

(71) Applicant: EBARA CORPORATION, Tokyo (JP)

(72) Inventors: Masayuki Nakanishi, Tokyo (JP); Kenji Kodera, Tokyo (JP); Yasuyuki Miyasawa, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 184 days.

(21) Appl. No.: 15/839,191

(22) Filed: Dec. 12, 2017

(65) Prior Publication Data

US 2018/0169820 A1 Jun. 21, 2018

(30) Foreign Application Priority Data

Dec. 15, 2016 (JP) ................................ 2016-243295
Oct. 31, 2017 (JP) ................................ 2017-210426

(51) Int. Cl.
| | | |
|---|---|---|
| *B24B 9/06* | (2006.01) | |
| *B24B 21/00* | (2006.01) | |
| *B24B 21/08* | (2006.01) | |
| *H01L 21/02* | (2006.01) | |
| *B24B 37/07* | (2012.01) | |
| *B24B 31/12* | (2006.01) | |

(52) U.S. Cl.
CPC ............ *B24B 9/065* (2013.01); *B24B 21/002* (2013.01); *B24B 21/08* (2013.01); *B24B 37/07* (2013.01); *H01L 21/02021* (2013.01); *B24B 31/12* (2013.01)

(58) Field of Classification Search
CPC ............................. B24B 9/065; B24B 21/002
USPC ........................................................ 451/303
See application file for complete search history.

(56) References Cited

U.S. PATENT DOCUMENTS

| | | | |
|---|---|---|---|
| 6,558,239 B2 * | 5/2003 | Kunisawa | ............... B24B 9/065 451/303 |
| 8,517,804 B2 * | 8/2013 | Weigmann | ............. B24B 21/02 451/303 |
| 2003/0139049 A1 | 7/2003 | Nakamura et al. | |

(Continued)

FOREIGN PATENT DOCUMENTS

| | | |
|---|---|---|
| JP | 2008-042220 A | 2/2008 |
| JP | 2009-018363 A | 1/2009 |
| JP | 5254575 B2 | 8/2013 |

OTHER PUBLICATIONS

European Patent Application No. 17206505.4; Extended Search Report; dated May 28, 2018; 8 pages.

*Primary Examiner* — George B Nguyen
(74) *Attorney, Agent, or Firm* — BakerHostetler

(57) ABSTRACT

A polishing apparatus which can keep a width of a polishing tool constant when a peripheral portion of a substrate is polished by the polishing tool is disclosed. The polishing apparatus includes a substrate holder 3 configured to hold a substrate W and to rotate the substrate W, and a pressing pad 50 configured to press a polishing tool 23 against a peripheral portion of the substrate W held by the substrate holder 3. The pressing pad 50 includes an elastic member 55 having a pressing surface 55a configured to press the polishing tool 23 against the peripheral portion of the substrate W and a support member 56 configured to support the elastic member 55. The support member 56 has a recess 57 formed in a front surface 56a of the support member 56, the elastic member 55 being capable of entering the recess 57.

14 Claims, 30 Drawing Sheets

(56) References Cited

U.S. PATENT DOCUMENTS

| | | | |
|---|---|---|---|
| 2009/0004952 A1* | 1/2009 | Takahashi | B24B 9/065 451/44 |
| 2009/0017730 A1* | 1/2009 | Kubota | B24B 9/065 451/41 |
| 2009/0017733 A1* | 1/2009 | Takahashi | B24B 9/065 451/57 |
| 2009/0275269 A1* | 11/2009 | Sakairi | B24B 9/065 451/44 |
| 2011/0003537 A1 | 1/2011 | Fukushima et al. | |
| 2011/0003540 A1 | 1/2011 | Takahashi et al. | |

* cited by examiner

POLISHING APPARATUS AND PRESSING PAD FOR PRESSING POLISHING TOOL

CROSS REFERENCE TO RELATED APPLICATIONS

This document claims priority to Japanese Patent Application No. 2016-243295, filed Dec. 15, 2016 and Japanese Patent Application No. 2017-210426, filed Oct. 31, 2017, the entire contents of which are hereby incorporated by reference.

BACKGROUND

From a viewpoint of improving yield in fabrication of semiconductor devices, management of surface conditions of a peripheral portion of a substrate has been attracting attention in recent years. In the fabrication process of the semiconductor devices, various materials are deposited on a silicon wafer to form a multilayer structure. As a result, unwanted films and roughened surface are formed on a peripheral portion of the substrate. It has been a recent trend to transport the substrate by holding only its peripheral portion using arms. Under such circumstances, the unwanted films remaining on the peripheral portion would be peeled off during various processes and could adhere to devices, causing lowered yield. Thus, in order to remove the unwanted films formed on the peripheral portion of the substrate, the peripheral portion of the substrate is polished using a polishing apparatus. In this specification, the peripheral portion of the substrate is defined as a region including a bevel portion which is the outermost portion of the substrate, and a top edge portion and a bottom edge portion located radially inwardly of the bevel portion.

FIG. 23A and FIG. 23B are enlarged cross-sectional views each showing a peripheral portion of a wafer as an example of a substrate. More specifically, FIG. 23A is a cross-sectional view of a so-called straight-type wafer, and FIG. 23B is a cross-sectional view of a so-called round-type wafer. In the wafer W shown in FIG. 23A, the bevel portion is an outermost circumferential surface of the wafer W (indicated by a letter B) that is constituted by an upper slope portion (an upper bevel portion) P, a lower slope portion (a lower bevel portion) Q, and a side portion (an apex) R. In the wafer W shown in FIG. 23B, the bevel portion is a portion (indicated by a letter B) having a curved cross section and forming an outermost circumferential surface of the wafer W. A top edge portion is a flat portion E1 located radially inwardly of the bevel portion B. A bottom edge portion is a flat portion E2 located on the opposite side of the top edge portion and located radially inwardly of the bevel portion B. The top edge portion may also include a region where the devices are formed.

As an apparatus for removing such films formed on the peripheral portion of the wafer W, there has been known a polishing apparatus using a polishing tool such as a polishing tape (for example, see Japanese Patent No. 5254575). This type of polishing apparatus has a substrate holder for holding a wafer W and rotating the wafer W, and a polishing head for bringing the polishing tape (polishing tool) into contact with the peripheral portion of the wafer W. The polishing head has a pressing pad for pressing the polishing tape against the peripheral portion of the wafer W. The pressing pad disposed on the reverse side of the polishing tape presses a polishing surface of the polishing tape against the peripheral portion of the wafer W, thereby polishing the peripheral portion of the wafer W. As the polishing tool, a strip-shaped polishing cloth may be used in place of the polishing tape.

FIG. 24 is a perspective view showing an example of a conventional pressing pad. As shown in FIG. 24, a pressing pad 150 has an elastic member 155 having a rectangular pressing surface 155a, and a pad body 154 to which the elastic member 155 is secured. The elastic member 155 is fixed to the pad body 154 in a state where an entire rear surface on an opposite side of the pressing surface 155a is brought in contact with the pad body 154. The pressing pad 150 is disposed on the reverse side of the polishing tape and presses the front surface (polishing surface) of the polishing tape against the bevel portion B of the wafer W by the pressing surface 155a of the elastic member 155. The elastic member 155 of the pressing pad 150 is made of a material such as rubber or sponge. For example, urethane rubber or silicon sponge with a hardness (e.g., 20 to 40 degrees) suitable for polishing a substrate is selected as a material of the elastic member 155.

FIG. 25 is a schematic view showing the state where the bevel portion B of the wafer W is polished by a polishing head 130 having the pressing pad 150 shown in FIG. 24. As shown in FIG. 25, the polishing head 130 has the pressing pad 150 for pressing a polishing tape 123 against the peripheral portion of the wafer W, an air cylinder (driving mechanism) 152 for moving the pressing pad 150 toward the peripheral portion of the wafer W, and a tape feed mechanism 142 for feeding the polishing tape 123 in a predetermined direction. The force of the pressing pad 150 that presses the polishing tape 123 against the wafer W is regulated by controlling air pressure supplied to the air cylinder 152. During polishing of the bevel portion B of the wafer W, the polishing head 130 (i.e., the pressing pad 150) is inclined with respect to the wafer W by a tilting mechanism (not shown). While the polishing head 130 is inclined with respect to the wafer W, the pressing surface 155a of the elastic member 155 of the pressing pad 150 presses the polishing tape 123 against the bevel portion B of the wafer W, thereby polishing the entire bevel portion B by the polishing tape 123.

When the polishing head 130 (i.e., the pressing pad 150) is inclined with respect to the wafer W to polish the entire bevel portion B, the width of the polishing tape 123 which is brought into contact with the bevel portion B of the wafer W is changed. FIG. 26 is a schematic view showing the width of the pressing surface 155a of the elastic member 155 which is brought into contact with the bevel portion B of the wafer W through the polishing tape 123 when the pressing surface 155a of the elastic member 155 of the pressing pad 150 shown in FIG. 24 is perpendicular to a flat surface of the wafer W. FIG. 27 is a schematic view showing the width of the pressing surface 155a of the elastic member 155 which is brought into contact with the bevel portion B of the wafer W through the polishing tape 123 when the pressing surface 155a of the elastic member 155 of the pressing pad 150 shown in FIG. 24 is inclined with respect to the flat surface of the wafer W. In FIGS. 26 and 27, although the polishing tape 123 is not shown for the sake of simplifying the explanation, the width of the polishing tape 123 which is brought into contact with the bevel portion B of the wafer W during polishing corresponds to the width of the pressing surface 155a of the elastic member 155 which is brought into contact with the bevel portion B of the wafer W through the polishing tape 123.

As shown in FIGS. 26 and 27, the width Wa of the polishing tape which is brought into contact with the bevel portion B of the wafer W when the pressing surface 155a is perpendicular to the flat surface of the wafer W is smaller than the width Wb of the polishing tape which is brought into contact with the bevel portion B of the wafer W when the pressing surface 155a is inclined with respect to the flat surface of the wafer W. As the inclination angle of the pressing surface 155a with respect to the flat surface of the wafer W becomes larger, the width of the polishing tape which is brought into contact with the bevel portion B of the wafer W becomes larger.

FIG. 28 is a photograph showing polishing impressions formed in the polishing tape 123 when the bevel portion B is polished by pressing the polishing tape 123 against the bevel portion B of the wafer W with the conventional pressing pad 150. FIG. 28 shows a plurality of polishing impressions when the bevel portion B of the wafer W has been polished by changing the inclination angle θ of the pressing surface 155a with respect to the flat surface of the wafer W every 10 degrees. FIGS. 29A, 29B and 29C are schematic views showing the inclination angle θ of the pressing surface 155a with respect to the flat surface of the wafer W. In FIGS. 29A, 29B and 29C, the polishing tape 123 is shown as a vertical cross section along a center of the pressing surface 155a. As shown in FIG. 29A, this inclination angle θ is zero degree when the pressing surface 155a of the elastic membrane 155 of the pressing pad 150 is perpendicular to the flat surface of the wafer W. This inclination angle θ becomes a value of plus when the pressing surface 155a is inclined in a direction where the upper end of the pressing surface 155a approaches the flat surface of the wafer W as shown in FIG. 29B, and becomes a value of minus when the pressing surface 155a is inclined in a direction where the upper end of the pressing surface 155a moves away from the flat surface of the wafer W as shown in FIG. 29C.

As can be seen from the photograph shown in FIG. 28, as an absolute value of the inclination angle θ becomes larger, the polishing impression becomes larger in length. For example, the length La of the polishing impression when the inclination angle θ is 0° is smaller than the length Lb of the polishing impression when the inclination angle θ is 70°. The difference in length between the polishing impressions corresponds to the difference in width between the polishing tapes 123 which are brought into contact with the bevel portion B of the wafer W. As the width of the polishing tape 123 which is brought into contact with the bevel portion B of the wafer W is smaller, the polishing tape 123 which contributes to polishing of the bevel portion B is smaller in amount. As a result, the polishing rate when the absolute value of the inclination angle θ of the pressing surface 155a is small is lower than the polishing rate when the absolute value of the inclination angle θ of the pressing surface 155a is large.

Further, as can be seen from the photograph shown in FIG. 28, when the absolute value of the inclination angle θ is small, brightness of color at a central region of the polishing impression is higher than brightness of color at an outer region of the polishing impression. As shown in FIG. 30, the difference in brightness of color of the polishing impression means that a pressing force Fa at a central part of a contact area between the polishing tape 123 and the bevel portion B of the wafer W is larger than a pressing force Fb at an outer part of the contact area between the polishing tape 123 and the bevel portion B of the wafer W. In this case, the polishing tape 123 is liable to be clogged at the central part of the contact area of the polishing tape, thus lowering the polishing rate.

SUMMARY OF THE INVENTION

According to an embodiment, there is provided a polishing apparatus which can keep a width of a polishing tool, which is brought into contact with a peripheral portion of a substrate, constant when the peripheral portion of the substrate is polished by the polishing tool while the polishing tool is inclined with respect to the substrate. Further, according to an embodiment, there is provided a pressing pad for pressing the polishing tool used in such polishing apparatus.

Embodiments, which will be described below, relate to a polishing apparatus for polishing a substrate such as a wafer, and more particularly to a polishing apparatus for polishing a peripheral portion of a substrate using a polishing tool such as a polishing tape. Further, the below-described embodiments relate to a pressing pad for pressing the polishing tool against the peripheral portion of the substrate.

In an embodiment, there is provided a polishing apparatus comprising: a substrate holder configured to hold a substrate and to rotate the substrate; and a pressing pad configured to press a polishing tool against a peripheral portion of the substrate held by the substrate holder; wherein the pressing pad comprises: an elastic member having a pressing surface configured to press the polishing tool against the peripheral portion of the substrate; and a support member configured to support the elastic member; wherein the support member has a recess formed in a front surface of the support member, the elastic member being capable of entering the recess.

In an embodiment, the pressing pad further comprises a fixing means configured to fix both end portions of the elastic member to the support member.

In an embodiment, a bottom surface of the recess is curved.

In an embodiment, a sheet is attached to a rear surface on the opposite side of the pressing surface of the elastic member.

In an embodiment, the polishing tool comprises a polishing tape.

In an embodiment, a groove extending toward a rear surface on the opposite side of the pressing surface is formed in the pressing surface of the elastic member, and the elastic member has block bodies divided by the groove.

In an embodiment, the polishing tool comprises a whetstone attached to a front surface of the block body.

In an embodiment, there is provided a pressing pad for pressing a polishing tool configured to polish a peripheral portion of a substrate against the peripheral portion of the substrate, comprising: an elastic member having a pressing surface configured to press the polishing tool against the peripheral portion of the substrate; and a support member configured to support the elastic member; wherein the support member has a recess formed in a front surface of the support member, the elastic member being capable of entering the recess.

In an embodiment, the pressing pad further comprises a fixing means configured to fix both end portions of the elastic member to the support member.

In an embodiment, a bottom surface of the recess is curved.

In an embodiment, a sheet is attached to a rear surface on the opposite side of the pressing surface of the elastic member.

In an embodiment, the polishing tool comprises a polishing tape.

In an embodiment, a groove extending toward a rear surface on the opposite side of the pressing surface is formed in the pressing surface of the elastic member; and the elastic member has block bodies divided by the groove.

in an embodiment, a whetstone used as the polishing tool is attached to the front surface of the block body.

According to the above-described embodiments, when the pressing pad presses the polishing tool against the peripheral portion of the substrate which is rotating, the elastic member of the pressing pad enters the recess of the support member, and the elastic member is deformed in a shape along the peripheral portion of the substrate. As a result, the width of the polishing tool which is brought into contact with the substrate can be kept constant when the peripheral portion of the substrate is polished by the polishing tool while the polishing tool is inclined with respect to the substrate.

DESCRIPTION OF EMBODIMENTS

Embodiments will be described below with reference to the drawings.

Figure 1:
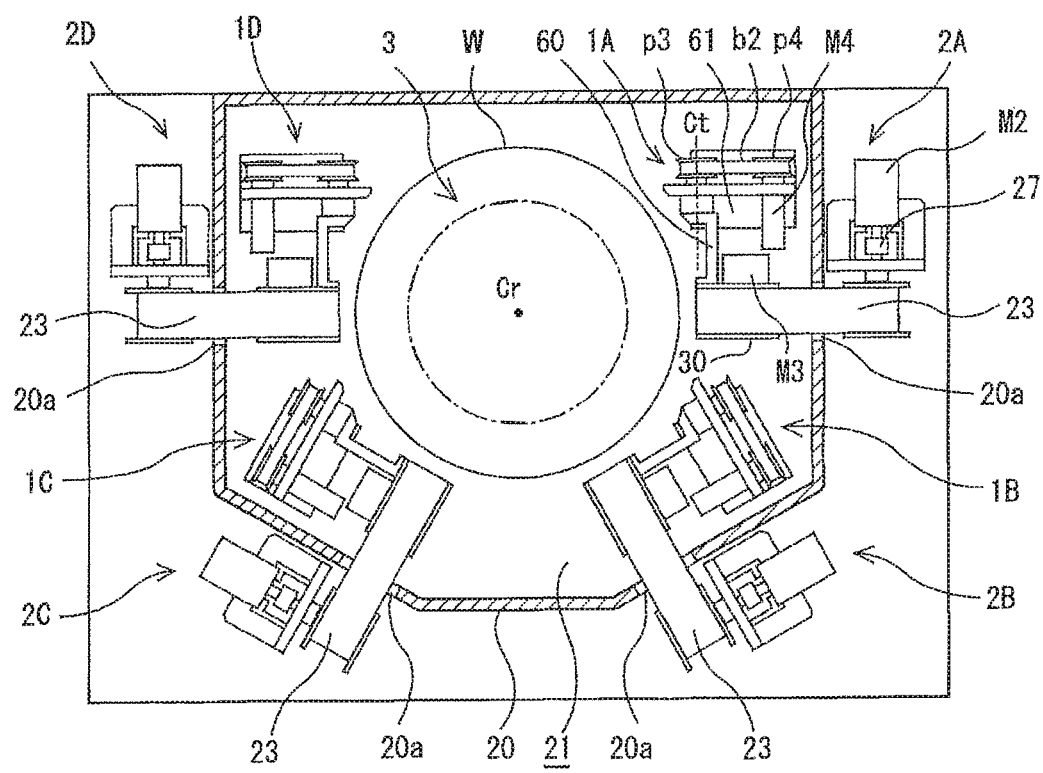
FIG. 1 is a plan view showing a polishing apparatus according to an embodiment.
Figure 2:
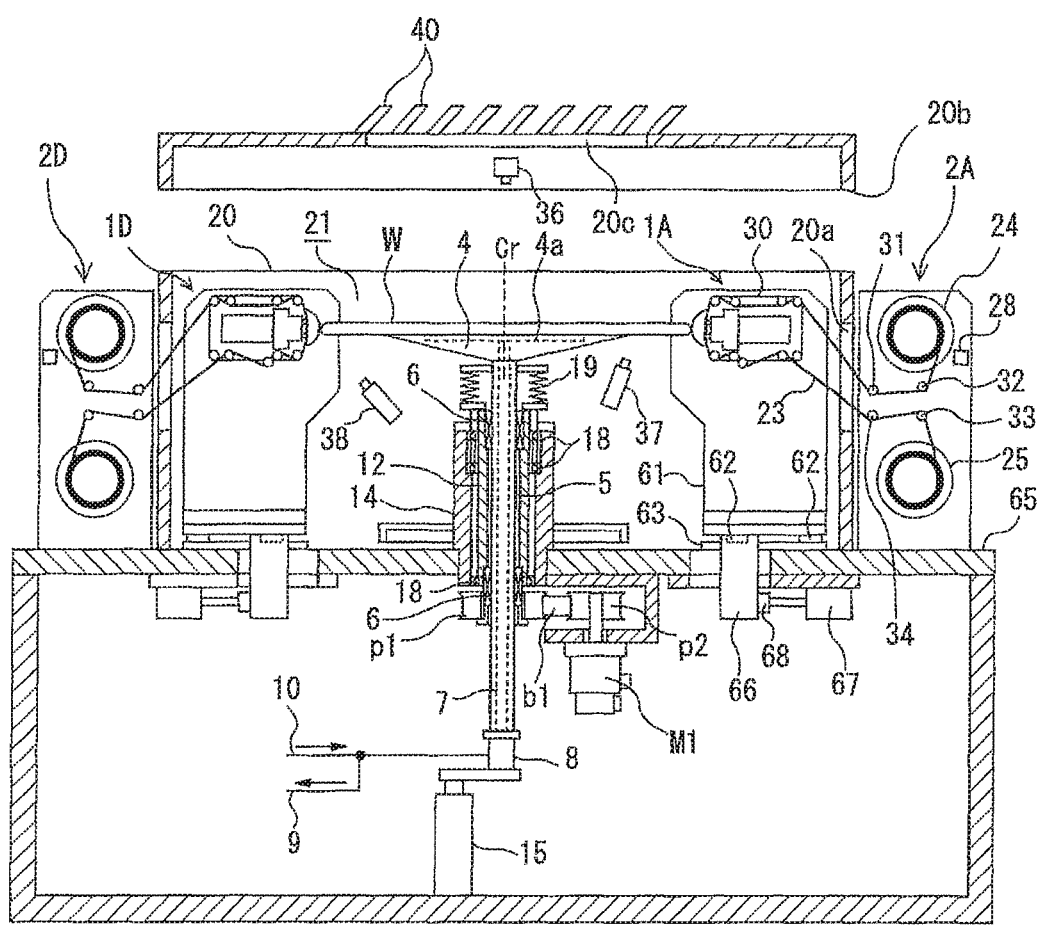
FIG. 2 is a vertical cross-sectional view of the polishing apparatus shown in FIG. 1.

FIG. 1 is a plan view showing a polishing apparatus according to an embodiment. FIG. 2 is a vertical cross-sectional view of the polishing apparatus shown in FIG. 1. As shown in FIG. 1 and FIG. 2, the polishing apparatus includes a rotary holding mechanism (a substrate holder) 3 configured to hold a wafer W as an example of a substrate horizontally and to rotate the wafer W. The rotary holding mechanism 3 is located in the center of the polishing apparatus. FIG. 1 shows a state in which the rotary holding mechanism 3 holds the wafer W. This rotary holding mechanism 3 has a dish-shaped holding stage 4 configured to hold a rear surface of the wafer W by a vacuum suction, a hollow shaft 5 coupled to a central portion of the holding stage 4, and a motor M1 for rotating the hollow shaft 5. The wafer W is placed onto the holding stage 4 by hands of a transporting mechanism (not shown) such that a center of the wafer W is aligned with a central axis of the hollow shaft 5.

The hollow shaft 5 is supported by ball spline bearings (i.e., linear motion bearings) 6 which allow the hollow shaft 5 to move vertically. The holding stage 4 has an upper surface having grooves 4a. These grooves 4a communicate with a communication passage 7 extending through the hollow shaft 5. According to an embodiment, a sheet in which grooves 4a communicating with the communication passage 7 extending through the hollow shaft 5 are formed may be attached to the upper surface of the holding stage 4. For example, the grooves 4a are formed by blanking of the sheet. The communication passage 7 is coupled to a vacuum line 9 via a rotary joint 8 provided on a lower end of the hollow shaft 5. The communication passage 7 is also coupled to a nitrogen-gas supply line 10 for use in releasing the wafer W from the holding stage 4 after processing. By selectively coupling the vacuum line 9 and the nitrogen-gas supply line 10 to the communication passage 7, the wafer W can be held on the upper surface of the holding stage 4 by the vacuum suction and can be released from the upper surface of the holding stage 4.

A pulley p1 is coupled to the hollow shaft 5, and a pulley p2 is mounted on a rotational shaft of the motor M1. The hollow shaft 5 is rotated by the motor M1 through the pulley p1, the pulley p2, and a belt b1 riding on these pulleys p1 and p2. With these structures, the wafer W, held on the upper surface of the holding stage 4, is rotated by the motor M1.

The ball spline bearing 6 is a bearing that allows the hollow shaft 5 to move freely in its longitudinal direction. The ball spline bearings 6 are secured to a cylindrical casing 12. Therefore, in the resent embodiment, the hollow shaft 5 can move linearly up and down relative to the casing 12, and the hollow shaft 5 and the casing 12 rotate in unison. The hollow shaft 5 is coupled to an air cylinder (elevating mechanism) 15, so that the hollow shaft 5 and the holding stage 4 are elevated and lowered by the air cylinder 15.

A cylindrical casing 14 is provided so as to surround the casing 12 in a coaxial arrangement. Radial bearings 18 are provided between the casing 12 and the cylindrical casing 14, so that the casing 12 is rotatably supported by the radial bearings 18. With these structures, the rotary holding mechanism 3 can rotate the wafer W about its central axis Cr and can elevate and lower the wafer W along the central axis Cr.

As shown in FIG. 1, tour polishing head assemblies (polishing units) 1A, 1B, 1C, and 1D are arranged around the wafer W held by the rotary holding mechanism 3. Polishing-tape supply mechanisms 2A, 2B, 2C, and 2D are provided radially outwardly of the polishing head assemblies 1A, 1B, 1C, and 1D, respectively. The polishing head assemblies 1A, 1B, 1C, and 1D are isolated from the polishing-tape supply mechanisms 2A, 2B, 2C, and 2D by a partition 20. An interior space of the partition 20 provides a polishing room 21. The four polishing head assemblies 1A, 1B, 1C, and 1D and the holding stage 4 are located in the polishing room 21. On the other hand, the polishing-tape supply mechanisms 2A, 2B, 2C, and 2D are located outside the partition 20 (i.e., outside the polishing room 21). The polishing head assemblies 1A, 1B, 1C, and 1D have the same structure, and the polishing-tape supply mechanisms 2A, 2B, 2C, and 2D also have the same structure. Hereinafter, the polishing head assembly 1A and the polishing-tape supply mechanism 2A will be described.

The polishing-tape supply mechanism 2A has a supply reel 24 for supplying a polishing tape 23 as an example of a polishing tool to the polishing head assembly 1A, and a recovery reel 25 for recovering the polishing tape 23 that has been used in polishing of the wafer W. The supply reel 24 is arranged above the recovery reel 25. Motors M2 are coupled to the supply reel 24 and the recovery reel 25, respectively, via couplings 27 (FIG. 1 shows only the coupling 27 and the motor M2 coupled to the supply reel 24). Each of the motors M2 is configured to exert a constant torque in a predetermined rotational direction so as to apply a predetermined tension to the polishing tape 23.

The polishing tape 23 is a long strip-shaped polishing tool, and one of surfaces of the polishing tape 23 provides a polishing surface. The polishing tape 23 includes a base tape made from PET sheet or the like and a polishing layer formed on the base tape. The polishing layer comprises a binder (e.g., resin) covering one surface of the base tape, and abrasive grains bound by the binder. A surface of the polishing layer provides the polishing surface. Instead of the polishing tape 23, a strip-shaped polishing cloth may be used as the polishing tool.

The polishing tape 23 is mounted on the polishing-tape supply mechanism 2A in a state where the polishing tape 23 is wound on the supply reel 24. Side surfaces of the wound polishing tape 23 are supported by reel plates so that the wound polishing tape 23 does not collapse. One end of the polishing tape 23 is attached to the recovery reel 25. The recovery reel 25 takes up the polishing tape 23 that has been supplied to the polishing head assembly 1A to thereby recover the polishing tape 23. The polishing head assembly 1A has a polishing head 30 for pressing the polishing tape 23, supplied from the polishing-tape supply mechanism 2A, against a peripheral portion of the wafer W. The polishing tape 23 is supplied to the polishing head 30 such that the polishing surface (front surface) of the polishing tape 23 faces the wafer W.

The polishing-tape supply mechanism 2A has plural guide rollers 31, 32, 33, and 34. The polishing tape 23, to be supplied to and recovered from the polishing head assembly 1A, is guided by these guide rollers 31, 32, 33, and 34. The polishing tape 23 is supplied to the polishing head 30 from the supply reel 24 through an opening 20a formed in the partition 20, and the polishing tape 23 that has been used is recovered by the recovery reel 25 through the opening 20a.

As shown in FIG. 2, an upper supply nozzle 36 is provided above the wafer W. This upper supply nozzle 36 is configured to supply a polishing liquid onto a center of an upper surface of the wafer W held by the rotary holding mechanism 3. Further, a lower supply nozzle 37 is provided for supplying a polishing liquid onto a boundary between the rear surface of the wafer W and the holding stage 4 of the rotary holding mechanism 3 (i.e., onto a peripheral portion of the holding stage 4). Typically, pure water is used as the polishing liquid. In a case of using silica as the abrasive grains of the polishing tape 23, ammonia may be used as the polishing liquid. The polishing apparatus further includes a cleaning nozzle 38 for cleaning the polishing head 30 after the polishing process. The wafer W is elevated by the rotary holding mechanism 3 after the polishing process, and then the cleaning nozzle 38 ejects cleaning water toward the polishing head 30, whereby the polishing head 30 is cleaned after the polishing process.

In order to isolate mechanical devices, such as the ball spline bearings 6 and the radial bearings 18, from the polishing room 21 when the hollow shaft 5 is elevated and lowered relative to the casing 12, the hollow shaft 5 and an upper end of the casing 12 are coupled to each other by a bellows 19 that is extensible and contractible in a vertical direction, as shown in FIG. 2. FIG. 2 shows a state in which the hollow shaft 5 is in a lowered position and the holding stage 4 is in a polishing position. After the polishing process, the air cylinder 15 elevates the wafer W, together with the holding stage 4 and the hollow shaft 5, to a transport position, where the wafer W is released from the holding stage 4.

The partition 20 has an entrance 20b through which the wafer W is transported into and removed from the polishing room 21. The entrance 20b is a horizontally extending cutout. Therefore, the wafer W, held by the transporting mechanism, can travel horizontally across the polishing room 21 through the entrance 20b. An upper surface of the partition 20 has an aperture 20c and louvers 40, and a lower surface of the partition 20 has a gas-discharge opening (not shown in the drawing). During the polishing process, the entrance 20b is closed by a non-illustrated shutter. Therefore, as a fan mechanism (not shown in the drawing) is driven to evacuate an air through the gas-discharge opening, downward flow of clean air is formed in the polishing room 21. Because the polishing process is performed under such conditions, the polishing liquid is prevented from scattering upwardly. Therefore, the polishing process can be performed while an upper space of the polishing room 21 is kept clean.

As shown in FIG. 1, the polishing head 30 is secured to one end of an arm 60, which is rotatable about an axis Ct extending parallel to a tangential direction of the wafer W. The other end of the arm 60 is coupled to a motor M4 via pulleys p3 and p4 and a belt b2. As the motor M4 rotates in a clockwise direction and a counterclockwise direction through a certain angle, the arm 60 rotates about the axis Ct through a certain angle. In this embodiment, the motor M4, the arm 60, the pulleys p3 and p4, and the belt b2 constitute a tilting mechanism for tilting the polishing head 30 with respect to the surface of the wafer W.

The tilting mechanism is mounted on a movable base 61. This movable base 61 is movably coupled to a base plate 65 via guides 62 and rails 63. The rails 63 extend linearly in a radial direction of the wafer W held on the rotary holding mechanism 3, so that the movable base 61 can move linearly in the radial direction of the wafer W. A connection plate 66, extending through the base plate 65, is secured to the movable base 61. A linear actuator 67 is coupled to the connection plate 66 via a joint 68. This linear actuator 67 is secured to the base plate 65 directly or indirectly.

The linear actuator 67 may comprise an air cylinder or a combination of a positioning motor and a ball screw. The linear actuator 67, the rails 63, and the guides 62 constitute a moving mechanism for linearly moving the polishing head 30 in the radial direction of the wafer W. Specifically, the moving mechanism is operable to move the polishing head 30 closer to and away from the wafer W along the rails 63. On the other hand, the polishing-tape supply mechanism 2A is fixed to the base plate 65.

Figure 3:
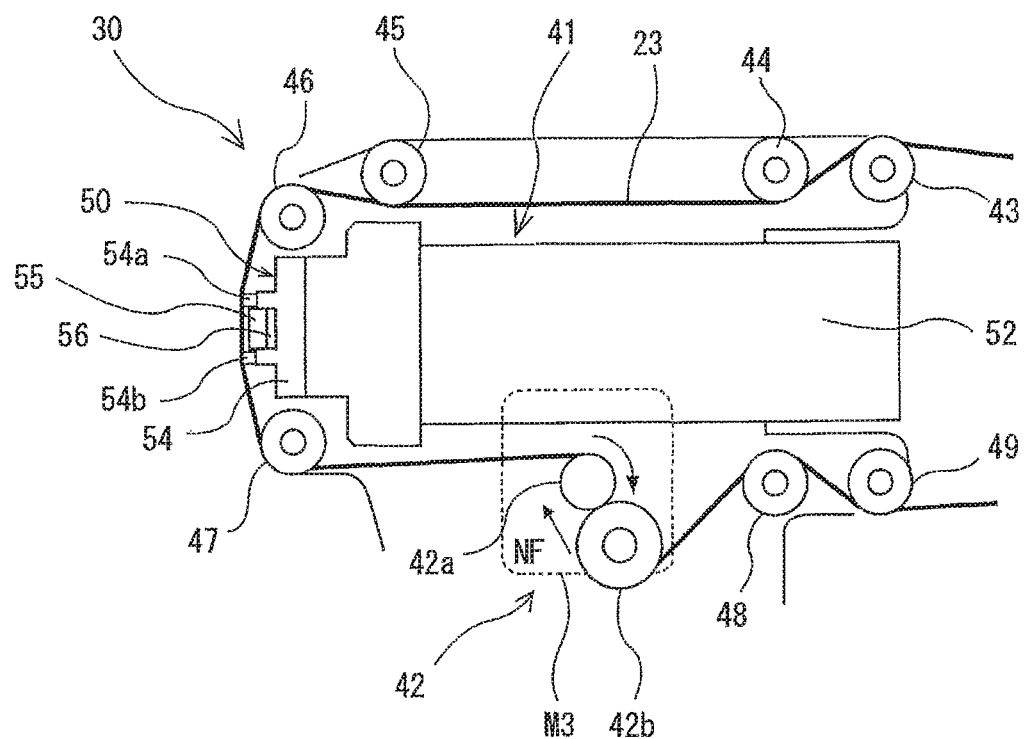
FIG. 3 is an enlarged view of a polishing head.

FIG. 3 is an enlarged view of the polishing head 30. As shown in FIG. 3, the polishing head 30 has a pressing mechanism 41 configured to press the polishing surface of the polishing tape 23 against the wafer W at predetermined force. The polishing head 30 further has a tape feed mechanism 42 configured to feed the polishing tape 23 from the supply reel 24 to the recovery reel 25. The polishing head 30 has plural guide rollers 43, 44, 45, 46, 47, 48, and 49, which guide the polishing tape 23 such that the polishing tape 23 travels in a direction perpendicular to the tangential direction of the wafer W.

The tape feed mechanism 42 provided in the polishing head 30 includes a tape feed roller 42a, a tape-holding roller 42b, and a motor M3 configured to rotate the tape feed roller 42a. The motor M3 is mounted on a side surface of the polishing head 30. The tape feed roller 42a is mounted to a rotational shaft of the motor M3. The tape-holding roller 42b is arranged adjacent to the tape feed roller 42a. The tape-holding roller 42b is supported by a non-illustrated mechanism, which biases the tape-holding roller 42b in a direction indicated by arrow NF in FIG. 3 (i.e., in a direction toward the tape feed roller 42a) so as to press the tape-holding roller 42b against the tape feed roller 42a.

As the motor M3 rotates in a direction indicated by arrow in FIG. 3, the tape feed roller 42a is rotated to feed the polishing tape 23 from the supply reel 24 to the recovery reel 25 via the polishing head 30. The tape-holding roller 42b is configured to be rotatable freely about its own axis and is rotated as the polishing tape 23 is fed.

The pressing mechanism 41 includes a pressing pad 50 located at the rear side of the polishing tape 23, and an air cylinder (an actuator) 52 configured to move the pressing pad 50 toward the peripheral portion of the wafer W. The air cylinder 52 is a so-called single rod cylinder. The force of the pressing pad 50 that presses the polishing tape 23 against the wafer W is regulated by controlling air pressure supplied to the air cylinder 52. The four polishing head assemblies 1A, 1B, 1C, and 1D arranged around the wafer W have the tilting mechanisms, the pressing mechanisms 41, the tape feed mechanisms 42, and the polishing-head moving mechanisms, which are capable of operating independently.

Figure 4:
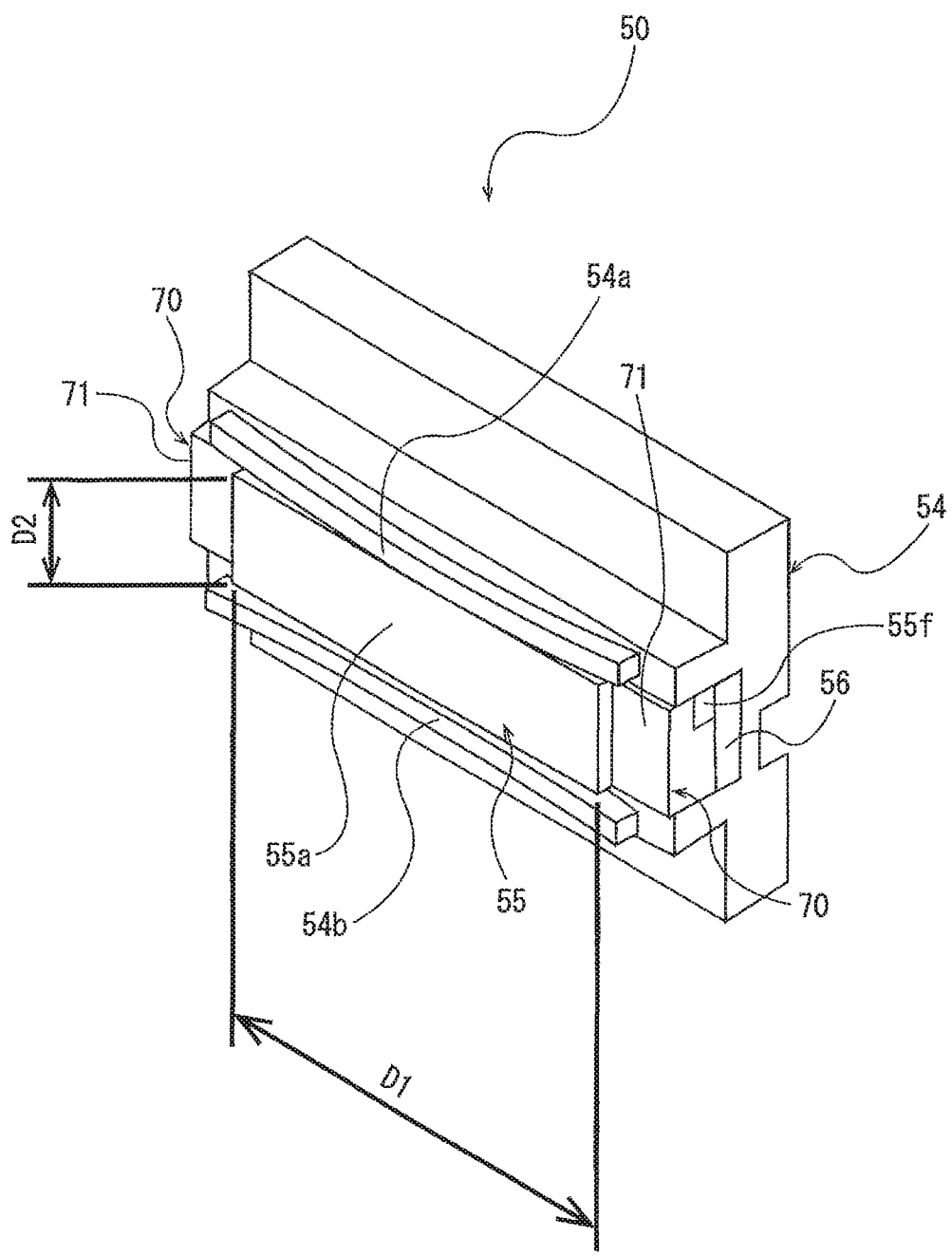
FIG. 4 is a perspective view showing a pressing pad schematically according to an embodiment.
Figure 5:
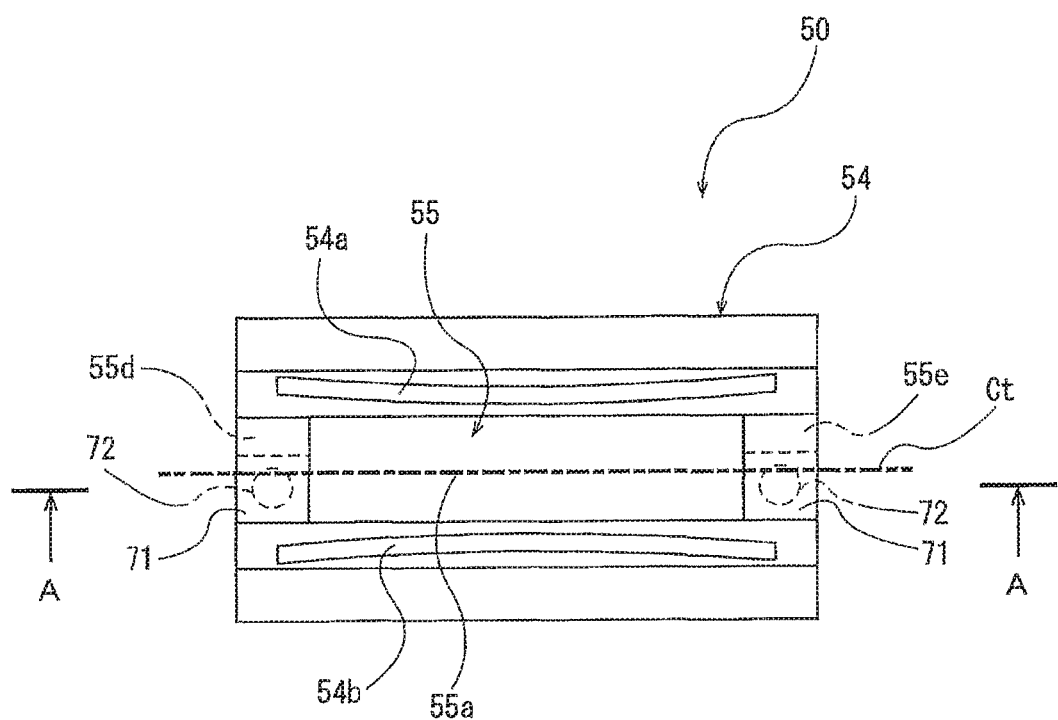
FIG. 5 is a schematic front view of the pressing pad shown in FIG. 4.
Figure 6:
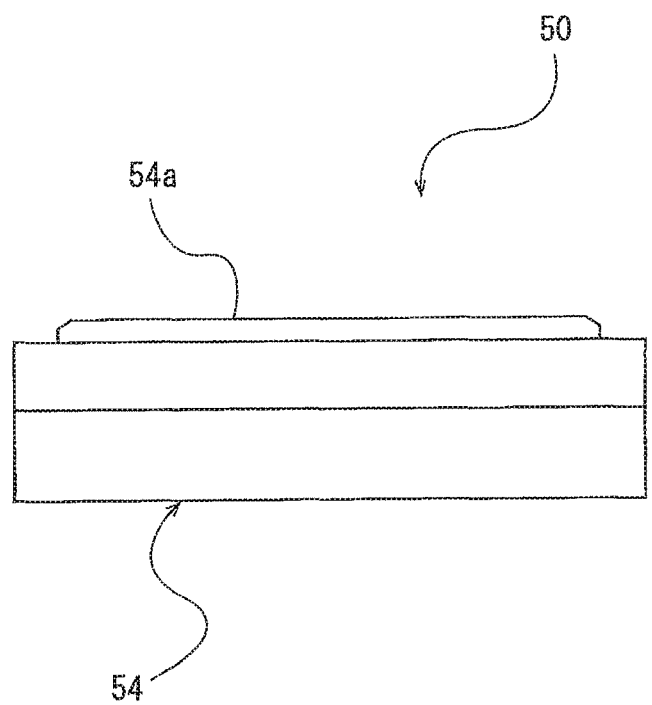
FIG. 6 is a schematic side view of the pressing pad shown in FIG. 4.

FIG. 4 is a perspective view showing the pressing pad 50 schematically according to an embodiment, FIG. 5 is a schematic front view of the pressing pad 50 shown in FIG. 4, and FIG. 6 is a schematic side view of the pressing pad 50 shown in FIG. 4.

As shown in FIGS. 4 to 6, the pressing pad 50 includes an elastic member 55 having a flat pressing surface 55a for directly pressing the polishing tape 23 against the peripheral portion of the wafer W, and a plate-like support member 56 for supporting the elastic member 55. Specific structures of the elastic member 55 and the support member 56 will be described later. In the present embodiment, the pressing pad 50 further includes a pad body 54, and the support member 56 is sandwiched between the elastic member 55 and the pad body 54.

The elastic member 55 is made of a material such as sponge or rubber. For example, silicon sponge with a hardness (e.g., 20 to 40 degrees) suitable for polishing the wafer W is selected as a material of the elastic member 55. The elastic member 55 may be made of rubber (e.g., urethane rubber) with a hardness (e.g., 20 to 40 degrees) suitable for polishing the wafer W. The support member 56 is made of a material harder than the elastic member 55. In the embodiments described below, the elastic member 55 is made of silicon sponge, and the elastic member 55 is referred to as a silicon sponge 55.

The pressing surface 55a of the silicon sponge 55 for directly pressing a rear surface (i.e., opposite surface of the polishing surface) of the polishing tape 23 is rectangular, and the width (dimension along a circumferential direction of the wafer W) D1 of the pressing surface 55a is larger than the height (dimension along a direction perpendicular to the surface of the wafer W) D2 of the pressing surface 55a.

In the present embodiment, the pressing pad 50 has two protrusions 54a and 54b formed on a front surface thereof. These protrusions 54a and 54b are in a shape of rail and are arranged in parallel. The protrusions 54a and 54b are curved along the circumferential direction of the wafer W. More specifically, the protrusions 54a and 54b have a circular arc shape whose curvature is substantially the same as a curvature of the wafer W.

The two protrusions 54a and 54b are symmetrical about the rotational axis Ct (see FIG. 1). As shown in FIG. 5, the protrusions 54a and 54b are curved inwardly toward the rotational axis Ct as viewed from a front of the pressing pad 50. The polishing head 30 is disposed such that a center line (i.e., the rotational axis Ct) extending between tip ends of the protrusions 54a and 54b coincides with a center of a thickness of the wafer W. The protrusions 54a and 54b are arranged such that the protrusions 54a and 54b are closer to the wafer W than the guide rollers 46 and 47 (see FIG. 3) that are disposed at the front of the polishing head 30, so that the polishing tape 23 is supported from the rear side thereof by the protrusions 54a and 54b. The pad body 54 including the protrusions 54a and 54b are made from resin, such as PEEK (polyetheretherketone).

As shown in FIGS. 4 and 5, the silicon sponge 55 is arranged between the two protrusions 54a and 54b. A height of the silicon sponge 55 is slightly lower than a height of the protrusions 54a and 54b. When the pressing pad 50 is moved toward the wafer W by the air cylinder 52 in a state where the polishing head 30 is kept horizontal, the silicon sponge 55 presses the polishing tape 23 from the rear side thereof against the bevel portion B of the wafer W.

Figure 7:
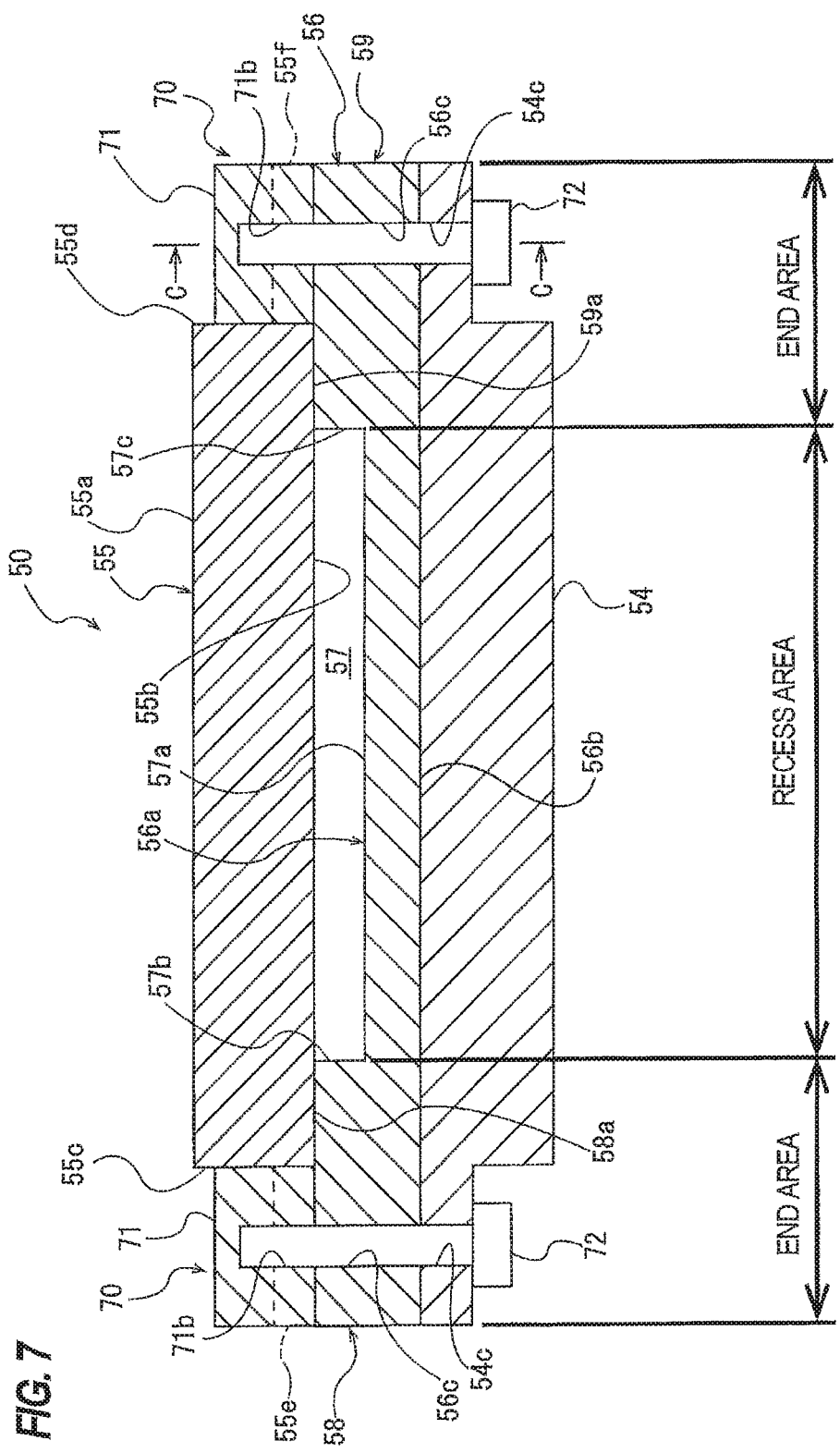
FIG. 7 is a cross-sectional view taken along line A-A of FIG. 5.
Figure 8A:
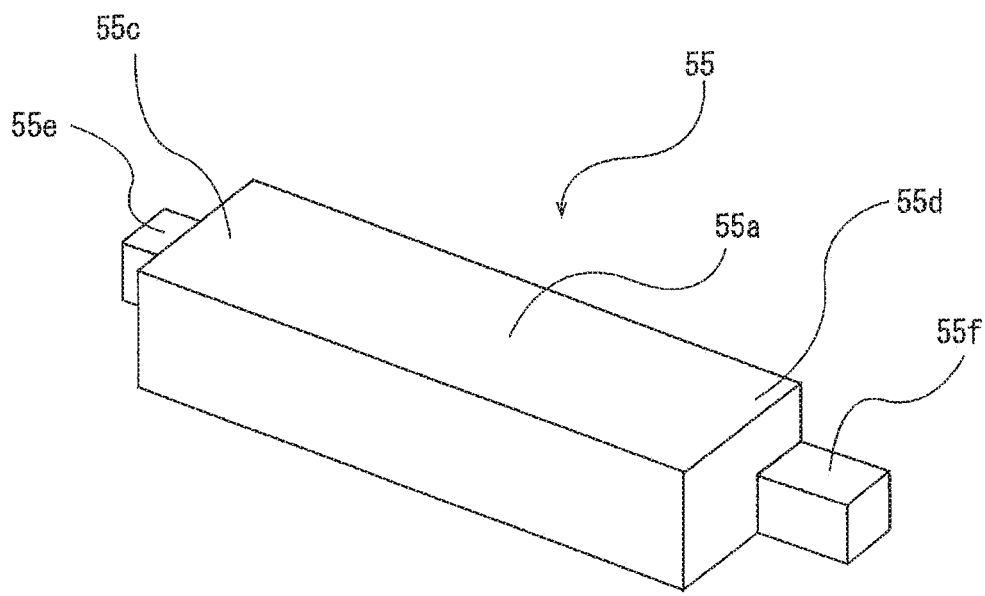
FIG. 8A is a schematic perspective view of a silicon sponge shown in FIG. 4.
Figure 8B:
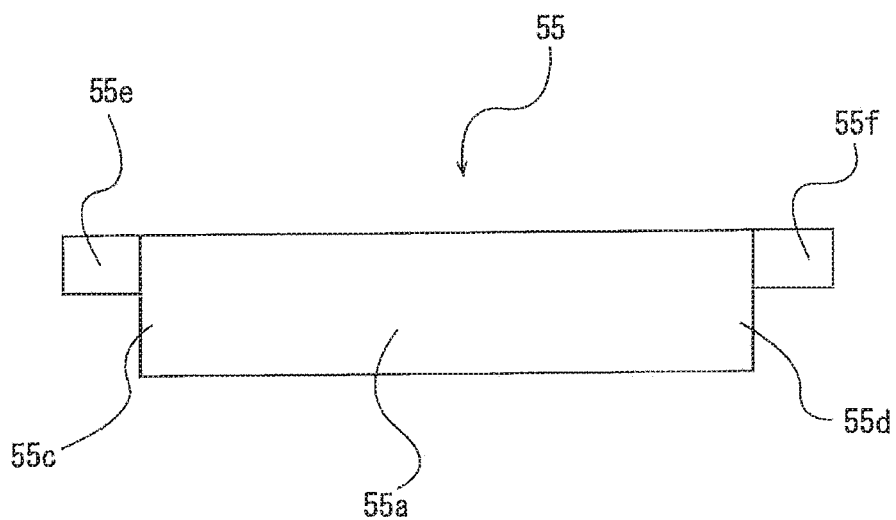
FIG. 8B is a schematic front view of the silicon sponge shown in FIG. 8A.
Figure 9A:
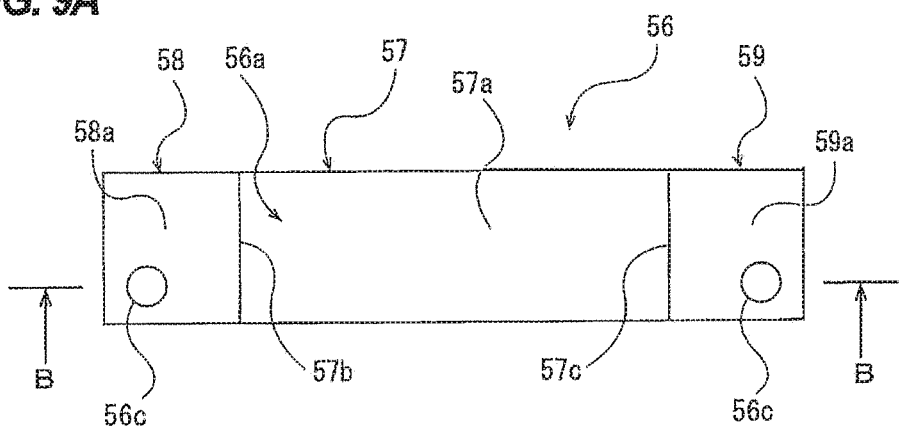
FIG. 9A is a front view of a support member shown in FIG. 4.
Figure 9B:
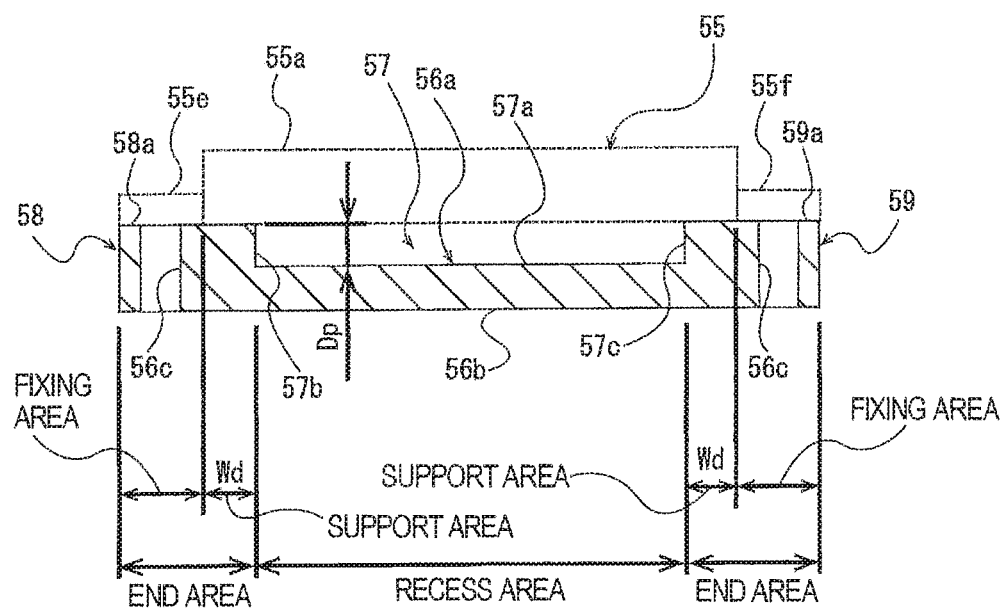
FIG. 9B is a cross-sectional view taken along line B-B of FIG. 9A.
Figure 10:
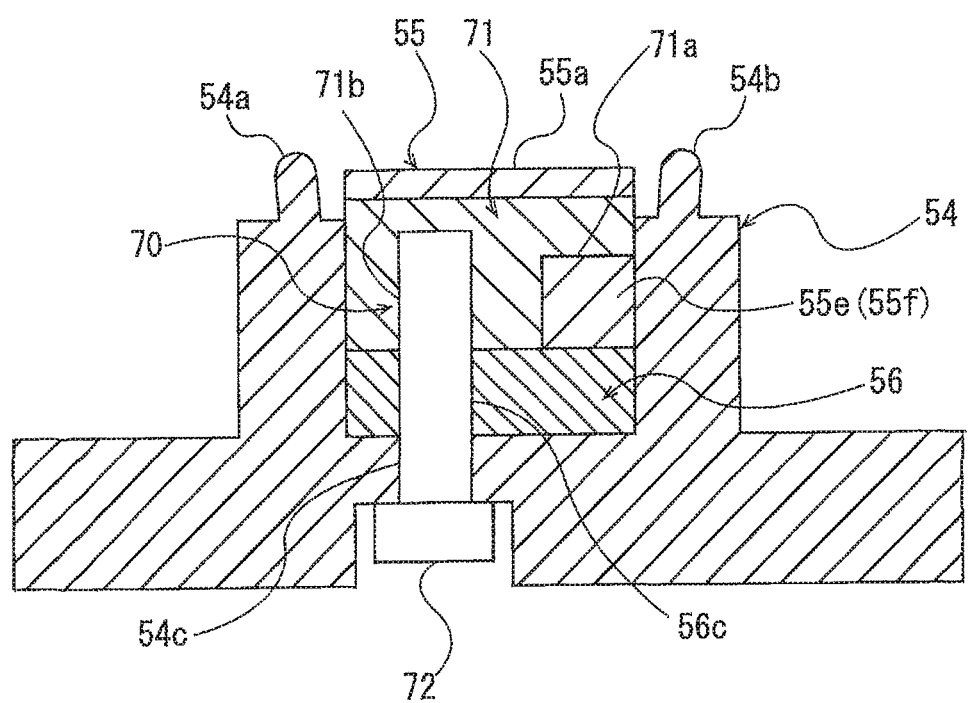
FIG. 10 is a cross-sectional view taken along line C-C of FIG. 7.

FIG. 7 is a cross-sectional view taken along line A-A of FIG. 5, FIG. 8A is a schematic perspective view of the silicon sponge 55 shown in FIG. 4, and FIG. 8B is a schematic front view of the silicon sponge 55 shown in FIG. 8A. FIG. 9A is a front view of the support member 56 shown in FIG. 4, and FIG. 9B is a cross-sectional view taken along line B-B of FIG. 9A. In FIG. 9B, the silicon sponge 55 supported by the support member 56 is shown by imaginary lines (dotted lines). FIG. 10 is a cross-sectional view taken along line C-C of FIG. 7.

As shown in FIG. 7, both end portions 55c, 55d of the silicon sponge 55 are supported by the support member 56, and the both end portions 55c, 55d of the silicon sponge 55 are fixed to the support member 56 by a fixing means 70 (described later).

As shown in FIGS. 8A and 8B, the silicon sponge 55 has fixing projections 55e, 55f projecting from both side surfaces of the silicon sponge 55, respectively. The fixing projections 55e, 55f extend in a longitudinal direction of the silicon sponge 55. The fixing projection 55e constitutes a part of one end portion 55c of the silicon sponge 55 and the fixing projection 55f constitutes a part of the other end portion 55d of the silicon sponge 55.

As shown in FIGS. 9A and 9B, a recess 57 is formed in the front surface 56a of the support member 56. The recess 57 is formed between both end portions 58, 59 of the support member 56. Specifically, the support member 56 includes a recess area where the recess 57 is formed, and two end areas located outwardly of the recess area, respectively and forming the both end portions 58, 59 of the support member 56, respectively. One end portion 55c of the silicon sponge 55 is a part of the silicon sponge 55 facing one end portion 58 (i.e., one end area) of the support member 56. In the present embodiment, the end portion 55c of the silicon sponge 55 including the fixing projection 55e is brought in contact with the end portion 58 of the support member 56. One end area of the support member 56 comprises a fixing area facing the fixing projection 55e, and a support area facing the end portion 55c of the silicon sponge 55 except for the fixing projection 55e. Similarly, the other end portion 55d of the silicon sponge 55 is a part of the silicon sponge 55 facing the other end portion 59 (i.e., the other end area) of the support member 56. In the present embodiment, the end portion 55d of the silicon sponge 55 including the fixing projection 55f is brought in contact with the end portion 59 of the support member 56. The other end area of the support member 56 comprises a fixing area facing the fixing projection 55f, and a support area facing the end portion 55d of the silicon sponge 55 except for the fixing projection 55f. The support areas are areas formed on the support member 56 to support the silicon sponge 55 reliably, and the fixing areas are areas formed to fix the both end portions 55c, 55d of the silicon sponge 55 to the support member 56 by the fixing means 70 (described later).

By forming the recess 57 in the support member 56, the front surface 56a of the support member 56 is divided into a bottom surface 57a of the recess 57, a front surface 58a of the end portion 58, and a front surface 59a of the end portion 59. Specifically, the front surface 58a of the end portion 58 corresponds to a front surface of the support member 56 in one end area, and the front surface 59a of the end portion 59 corresponds to a front surface of the support member 56 in the other end area. In the present embodiment, the bottom surface 57a of the recess 57 is connected to the front surface 58a of one end portion 58 of the support member 56 through one side surface 57b of the recess 57, and is connected to the front surface 59a of the other end portion 59 of the support member 56 through the other side surface 57c of the recess 57.

As shown in FIG. 7, the front surfaces 58a, 59a of the both end portions 58, 59 of the support member 56 are brought in contact with the rear surface 55b at the opposite side of the pressing surface 55a of the silicon sponge 55. More specifically, the front surfaces 58a, 59a of the both end portions 58, 59 of the support member 56 are brought in contact with the rear surface of the end portion 55c of the silicon sponge 55 including the fixing projection 55e and the rear surface of the end portion 55d of the silicon sponge 55 including the fixing projection 55f, respectively. The rear surface (i.e., the opposite surface of the front surface 56a of the support member 56) 56b is brought in contact with the pad body 54.

Next, the fixing means 70 for fixing the both end portions 55c, 55d of the silicon sponge 55 to the support member 56 will be described with reference to FIGS. 7 and 10. The fixing means 70 is provided on each of the end portions of the pressing pad 50 and has a fixing block 71 and a screw 72 screwed into the fixing block 71. As shown in FIG. 10, the fixing block 71 of the fixing means 70 has a step portion 71a, and has an L-shaped cross-sectional shape. The step portion 71a has a shape corresponding to the fixing projection 55e (or 55f) of the silicon sponge 55 shown FIGS. 8A and 8B, and the fixing projection 55e (or 55f) is fitted with the step portion 71a. A threaded hole 71b into which the screw 72 is screwed is formed in the fixing block 71, and a through-hole 56c into which the screw 72 is inserted is formed in the fixing area (see FIG. 9B) of each end area of the support member 56. The through-hole 56c is formed at a position corresponding to the threaded hole 71b. Through-holes 54c into which the screws 72 are inserted are formed in the both end portions of the pad body 54, respectively, and these through-holes 54c are formed at positions corresponding to the threaded holes 71b.

The step portions 71a of the fixing blocks 71 are fitted with the fixing projections 55e, 55f of the silicon sponge 55, respectively in a state where the both end portions 55c, 55d of the silicon sponge 55 are supported on the both end portions 58, 59 of the support member 56. In this state, the screw 72 is inserted into the through-hole 54c of the pad body 54 and the through-hole 56c of the support member 56, and is further screwed into the threaded hole 71b of the fixing block 71. By this fixing operation, the both end portions 55c, 55d of the silicon sponge 55 is fixed to the support member 56, and the support member 56 to which the silicon sponge 55 is fixed is fixed to the pad body 54.

The fixing means for fixing the silicon sponge 55 and the support member 56 to the pad body 54 is not limited to the above-described embodiment including the fixing block 71 and the screw 72. For example, the silicon sponge 55 may be fixed to the support member 56 by a clip for clipping the both end portions 55c, 55d of the silicon sponge 55, the support member 56, and the pad body 54, and simultaneously, the silicon sponge 55 and the support member 56 may be fixed to the pad body 54. Alternatively, the both end portions 55c, 55d of the silicon sponge 55 may be attached (i.e., fixed) to the both end portions 58, 59 of the support member 56 with an adhesive, and the support member 56 to which the silicon sponge 55 is fixed may be fixed to the pad body 54 with an adhesive or screws.

Figure 11:
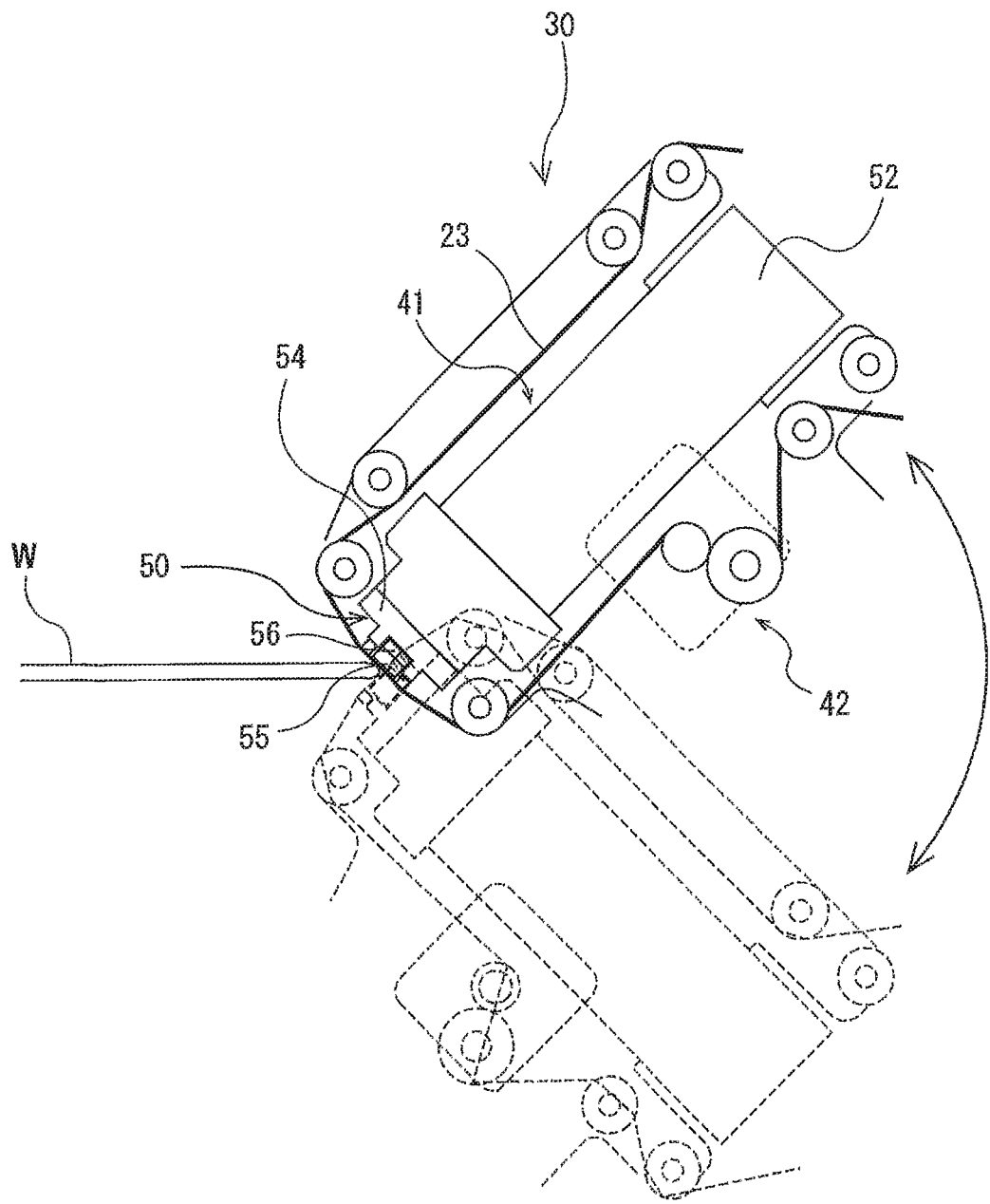
FIG. 11 is a view showing the manner in which the polishing head polishes a bevel portion of a wafer.

FIG. 11 is a view showing the manner in which the polishing head 30 polishes the bevel portion B of the wafer W. When polishing the bevel portion of the wafer W, as shown in FIG. 11, the polishing tape 23 is pressed against the bevel portion of the wafer W by the pressing pad 50 while the inclination angle of the polishing head 30 is changed intermittently or continuously by the above-described tilting mechanism. During polishing, the polishing tape may be fed at a predetermined speed by the tape feed mechanisms 42.

Figure 12:
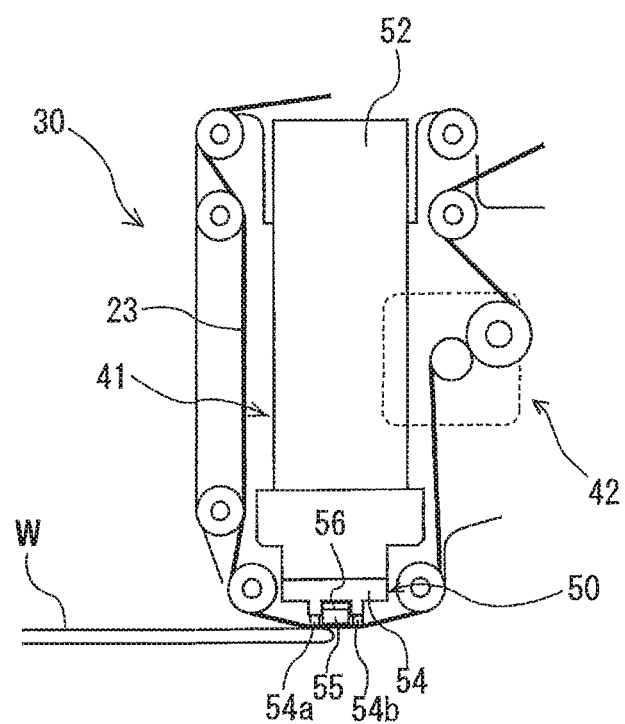
FIG. 12 is a view showing the manner in which the polishing head polishes a top edge portion of a wafer.
Figure 13:
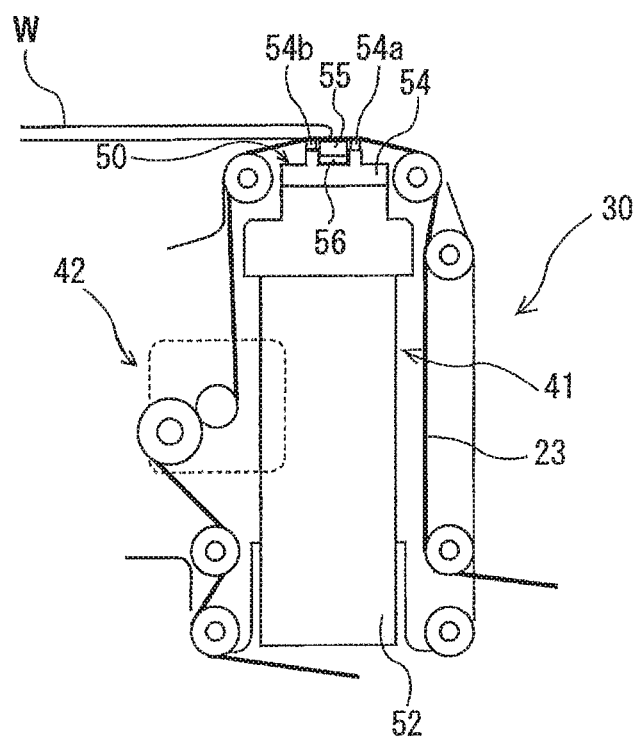
FIG. 13 is a view showing the manner in which the polishing head polishes a bottom edge portion of a wafer.

Further, the polishing head 30 having the pressing pad 50 according to the present embodiment is capable of polishing the top edge portion and the bottom edge portion of the wafer W. Specifically, as shown in FIG. 12, the polishing head 30 is inclined upward by the above-described tilting mechanism to allow the protrusion 54a to press the polishing tape 23 against the top edge portion of the wafer W, thereby polishing the top edge portion of the wafer W. Further, as shown in FIG. 13, the polishing head 30 is inclined downward to allow the protrusion 54b to press the polishing tape 23 against the bottom edge portion of the wafer W, thereby polishing the bottom edge portion of the wafer W.

As described above, the polishing head 30 according to the present embodiment can polish the entire peripheral portion of the wafer W including the top edge portion E1, the bevel portion B and the bottom edge portion E2. Each of the polishing head assemblies 1A to 1D (see FIG. 1) has the polishing head 30. Therefore, in order to improve the throughput of the polishing apparatus, all of the polishing head assemblies 1A to 1D may polish the entire peripheral portion of the wafer W including the top edge portion E1, the bevel portion B and the bottom edge portion E2. Alternatively, the polishing head assembly 1A may polish the top edge portion E1, the polishing head assembly 1B may polish the bevel portion B, and the polishing head assembly 1C may polish the bottom edge portion E2.

When the silicon sponge 55 of the pressing pad 50 is pressed against the bevel portion B of the wafer W through the polishing tape 23 under a predetermined force by the air cylinder 52 to polish the bevel portion B of the wafer W, the silicon sponge 55 is pushed back by the bevel portion B of the wafer W and is thus deformed. At this time, the silicon sponge 55 can easily enter the recess 57 of the support member 56 because the recess 57 is formed in the front surface 56a of the support member 56 and the silicon sponge 55 is supported at its end portions 55c, 55d by the support member 56.

Figure 14:
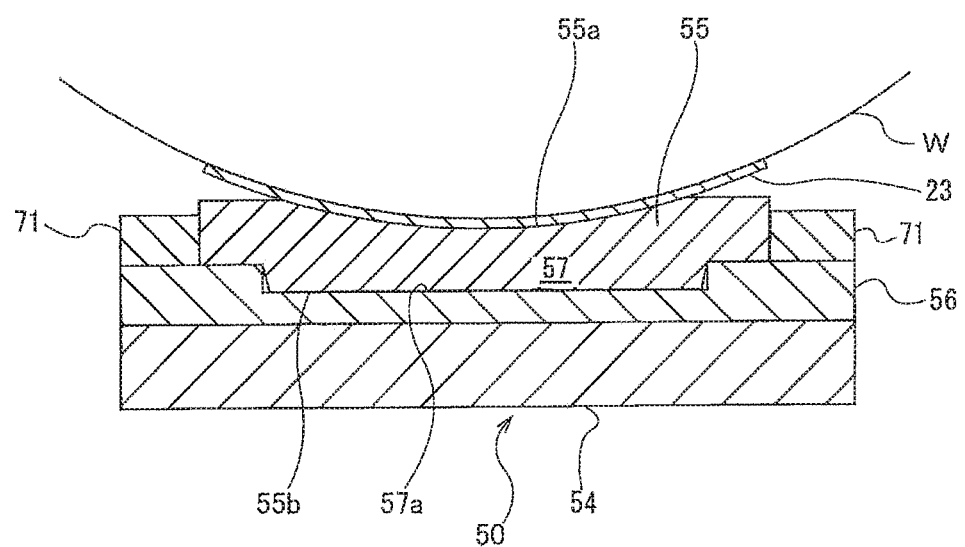
FIG. 14 is a schematic view showing the state where an elastic member enters the recess of the support member.
Figure 15A:
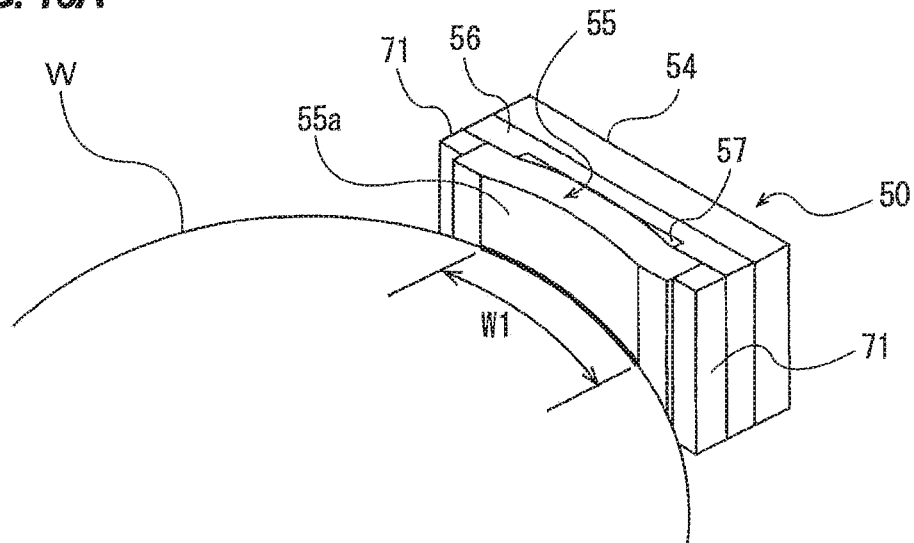
FIG. 15A is a schematic view showing an elastic member which has been pushed back by the bevel portion of the wafer and thus deformed when the pressing surface of the elastic member of the pressing pad is perpendicular to the flat surface of the wafer W.
Figure 15B:
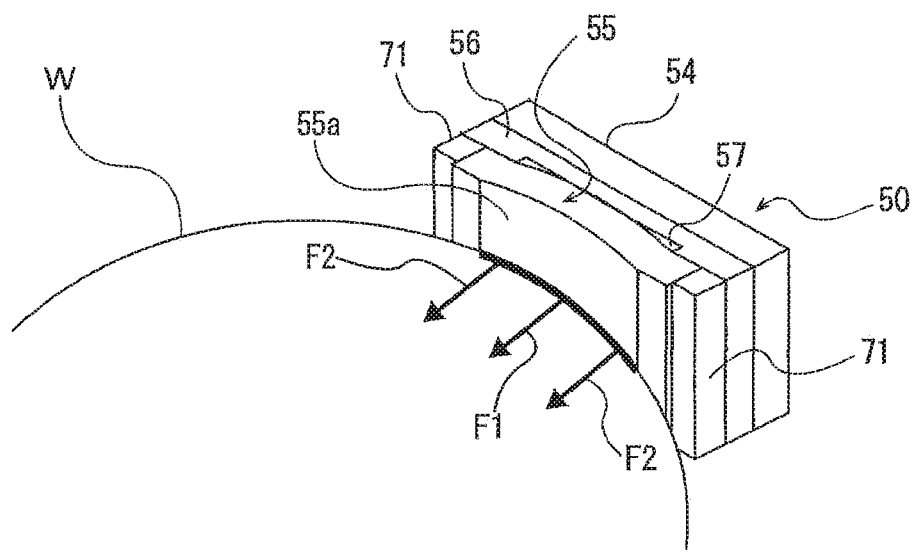
FIG. 15B is a schematic view showing pressing forces in a contact area between the bevel portion of the wafer and the polishing tape pressed by the pressing pad shown in FIG. 15A.
Figure 16A:
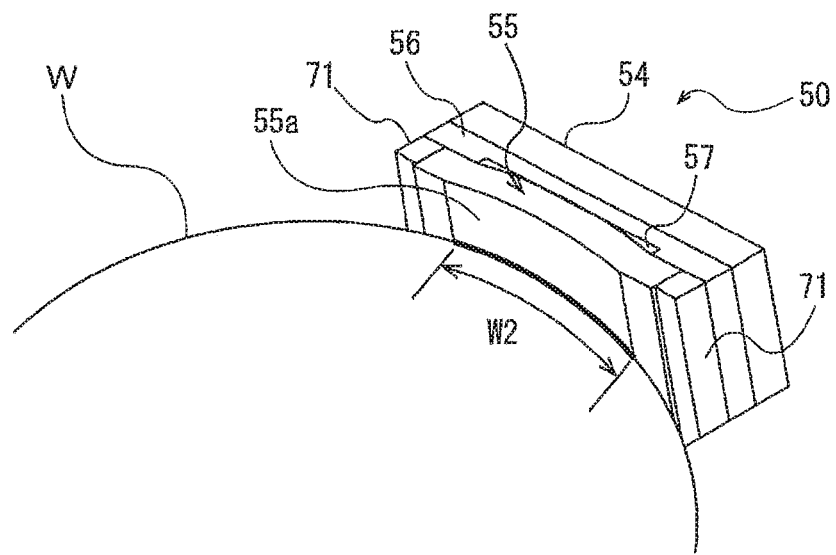
FIG. 16A is a schematic view showing the elastic member which has been pushed back by the bevel portion of the wafer and thus deformed when the pressing surface of the elastic member of the pressing pad is inclined with respect to the flat surface of the wafer.
Figure 16B:
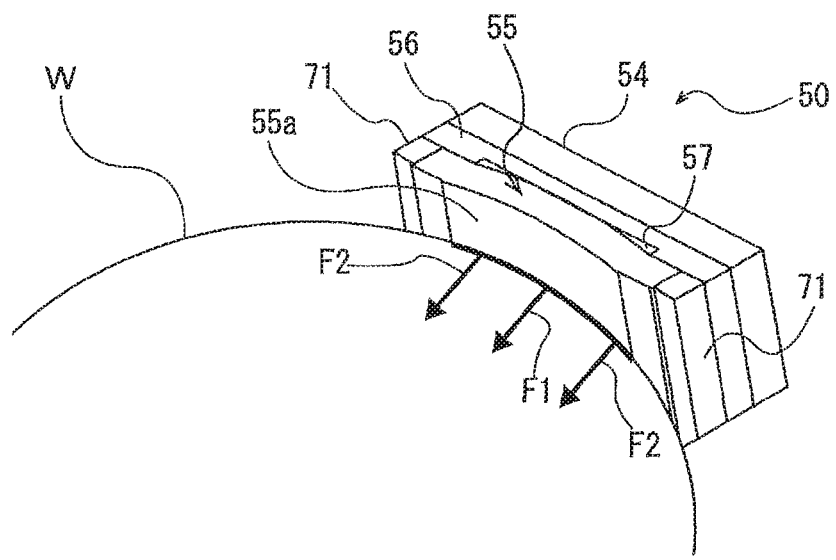
FIG. 16B is a schematic view showing pressing forces in a contact area between the bevel portion of the wafer and the polishing tape pressed by the pressing pad shown in FIG. 16A.

FIG. 14 is a schematic view showing the state where the silicon sponge 55 enters the recess 57 of the support member 56. FIG. 15A is a schematic view showing the silicon sponge 55 which has been pushed back by the bevel portion B of the wafer W and thus deformed when the pressing surface 55a of the silicon sponge 55 of the pressing pad 50 is perpendicular to the flat surface of the wafer W. FIG. 15B is a schematic view showing pressing forces in a contact area between the bevel portion B of the wafer W and the polishing tape 23 pressed by the pressing pad 50 shown in FIG. 15A. FIG. 16A is a schematic view showing the silicon sponge 55 which has been pushed back by the bevel portion B of the wafer W and thus deformed when the pressing surface 55a of the silicon sponge 55 of the pressing pad 50 is inclined with respect to the flat surface of the wafer W. FIG. 16B is a schematic view showing pressing forces in a contact area between the bevel portion B of the wafer W and the polishing tape 23 pressed by the pressing pad 50 shown in FIG. 16A.

In FIGS. 14 to 16B, the pressing pad 50 is schematically shown for the sake of facilitating understanding of the invention. More specifically, only the silicon sponge 55, the support member 56, the pad body 54 and the fixing blocks 71 of the fixing means 70 are schematically shown. Further, although the polishing tape 23 is not shown for the sake of simplifying the explanation in FIGS. 15A, 15B, 16A and 16B, during polishing of the bevel portion B of the wafer W, the pressing pad 50 presses the polishing tape 23 against the bevel portion B of the wafer W as shown in FIG. 14. More specifically, the pressing surface 55a of the silicon sponge 55 of the pressing pad 50 is brought into direct contact with the rear surface of the polishing tape 23, and in this state, the pressing pad 50 presses the front surface (polishing surface) of the polishing tape 23 against the bevel portion B of the wafer W. The width of the polishing tape 23 which is brought into contact with the bevel portion B of the wafer W during polishing corresponds to the width of the pressing surface 55a of the silicon sponge 55 which is brought into contact with the bevel portion B of the wafer W through the polishing tape 23.

As shown in FIG. 14, when the silicon sponge 55 of the pressing pad 50 is pressed against the bevel portion B of the wafer W through the polishing tape 23 under a predetermined force, the silicon sponge 55 is deformed so as to enter the recess 57 of the support member 56. The rear surface 55b of the silicon sponge 55 which has entered the recess 57 of the support member 56 is brought into contact with the bottom surface 57a of the recess 57, and the silicon sponge 55 is deformed in a shape along the bevel portion B of the wafer W as shown in FIGS. 15A and 16A. In this manner, by forming the recess 57 in the support member 56 so as to allow the silicon sponge 55 to enter the recess 57, the silicon sponge 55 can be deformed in a shape along the bevel portion B of the wafer W. As a result, even if the pressing surface 55a of the silicon sponge 55 is inclined with respect to the wafer W, the width of the polishing tape 23 which is brought into contact with the bevel portion B of the wafer W can be kept constant. Specifically, the width W1 (see FIG. 15A) of the polishing tape 23 which is brought into contact with the bevel portion B of the wafer W when the pressing surface 55a is perpendicular to the flat surface of the wafer W is equal to the width W2 (see FIG. 16A) of the polishing tape 23 which is brought into contact with the bevel portion B of the wafer W when the pressing surface 55a is inclined with respect to the flat surface of the wafer W.

The silicon sponge 55 comprises a foam containing a plurality of fine voids therein. For example, the silicon sponge 55 is formed by foaming silicon in a forming die. The surface of the silicon sponge 55 immediately after removing the silicon sponge 55 from the forming die is a smooth flat surface having no concavity and convexity. However, when this flat surface is cut off, voids in the silicon sponge 55 are exposed. Specifically, the concavity and convexity emerge on the surface of the silicon sponge 55 which has been cut off. For example, when the pressing surface 55a and/or the rear surface 55b of the silicon sponge 55 is cut off to adjust the height of the silicon sponge 55, the concavity and convexity emerge on the pressing surface 55a and/or the rear surface 55b which has been cut off.

When the silicon sponge 55 having the concavity and convexity on the pressing surface 55a and/or the rear surface 55b is pressed against the bevel portion B of the wafer W, the concavity and convexity of the pressing surface 55a and/or the rear surface 55b are crushed, and thus the silicon sponge 55 cannot be deformed in a desired shape along the bevel portion B of the wafer W in some cases. Therefore, it is preferable that the pressing surface 55a and/or the rear surface 55b of the silicon sponge 55 is configured to be a smooth flat surface without applying processing treatment such as cutting work to the pressing surface 55a and/or the rear surface 55b.

Figure 17:
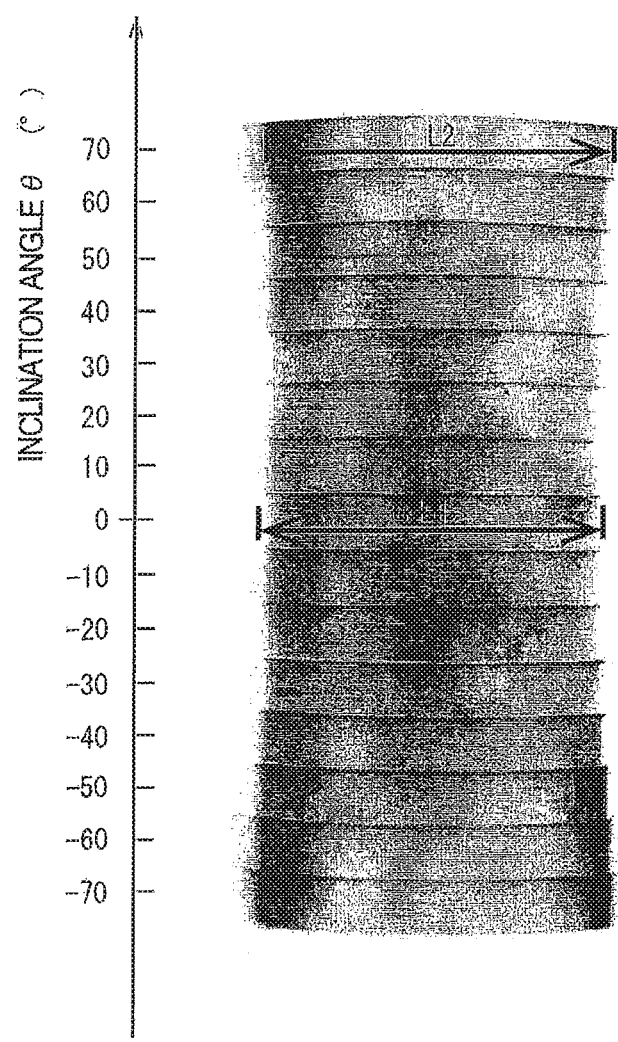
FIG. 17 is a photograph showing polishing impressions formed in the polishing tape when the bevel portion is polished by pressing the polishing tape against the bevel portion of the wafer with the pressing pad.

FIG. 17 is a photograph showing polishing impressions formed in the polishing tape 23 when the bevel portion B is polished by pressing the polishing tape 23 against the bevel portion B of the wafer W with the pressing pad 50 according to the present embodiment. FIG. 17 shows a plurality of polishing impressions when the bevel portion B of the wafer W has been polished by changing the inclination angle θ of the pressing surface 55a with respect to the flat surface of the wafer W every 10 degrees. This inclination angle θ is 0 degree when the pressing surface 55a of the silicon sponge 55 of the pressing pad 50 is perpendicular to the flat surface of the wafer W. This inclination angle θ becomes a value of plus when the pressing surface 55a is inclined in a direction where the upper end of the pressing surface 55a approaches the flat surface of the wafer W, and becomes a value of minus when the pressing surface 55a is inclined in a direction where the upper end of the pressing surface 55a moves away from the flat surface of the wafer W.

Figure 24:
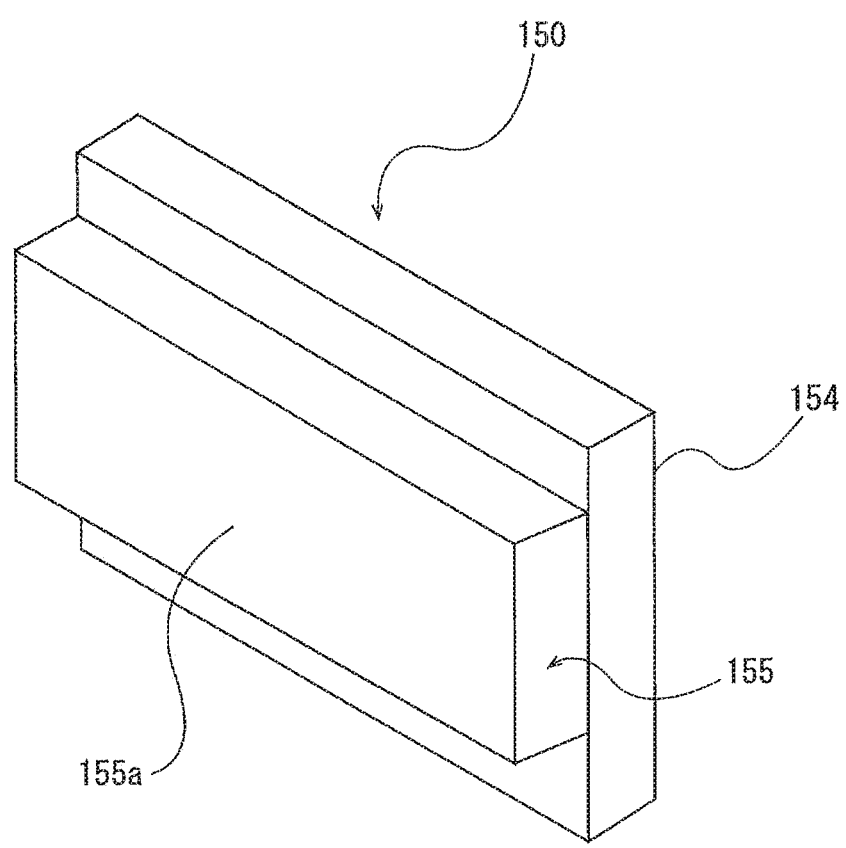
FIG. 24 is a perspective view showing an example of a conventional pressing pad.
Figure 25:
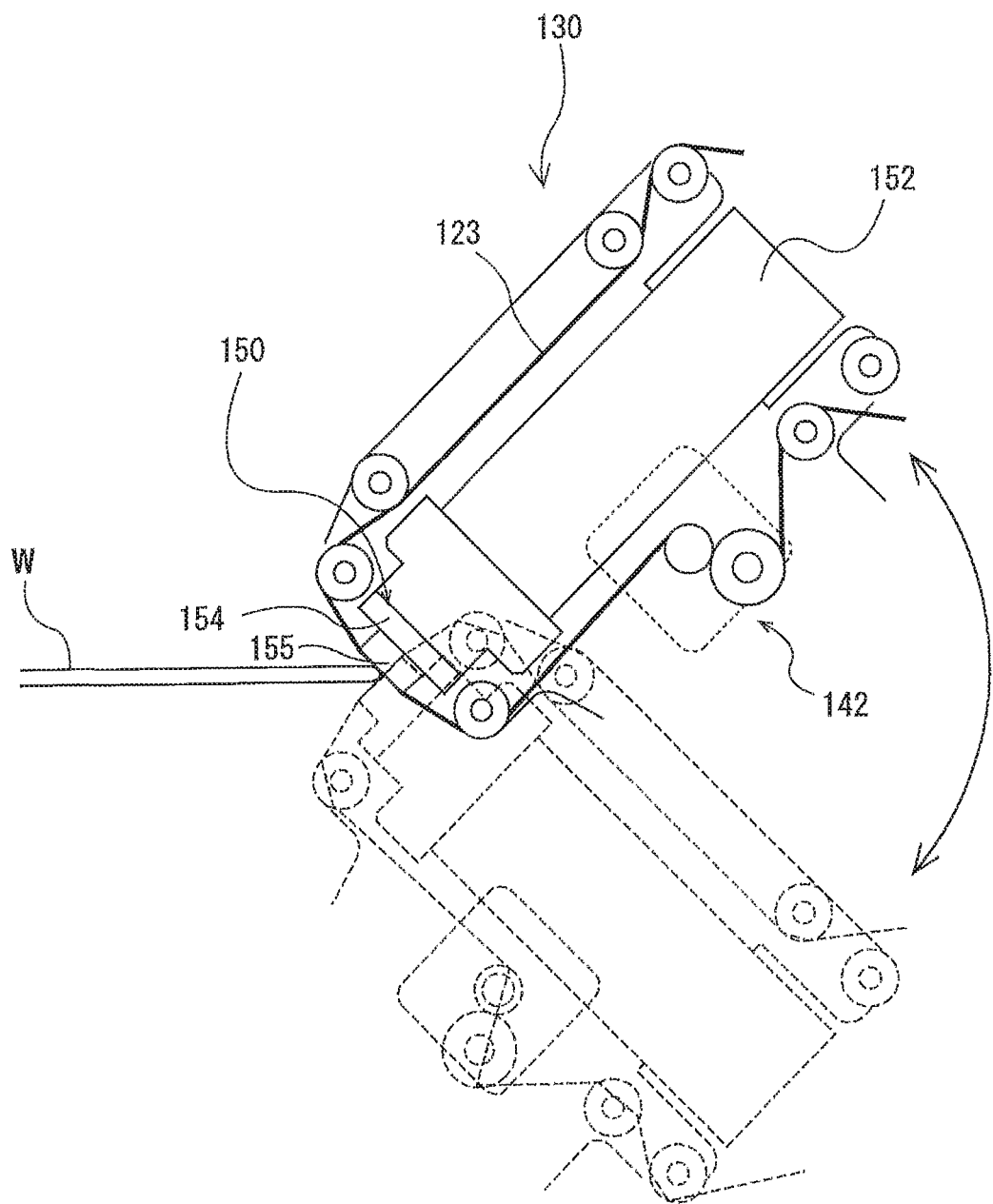
FIG. 25 is a schematic view showing the state where the bevel portion of the wafer is polished by a polishing head having the pressing pad shown in FIG. 24.
Figure 26:
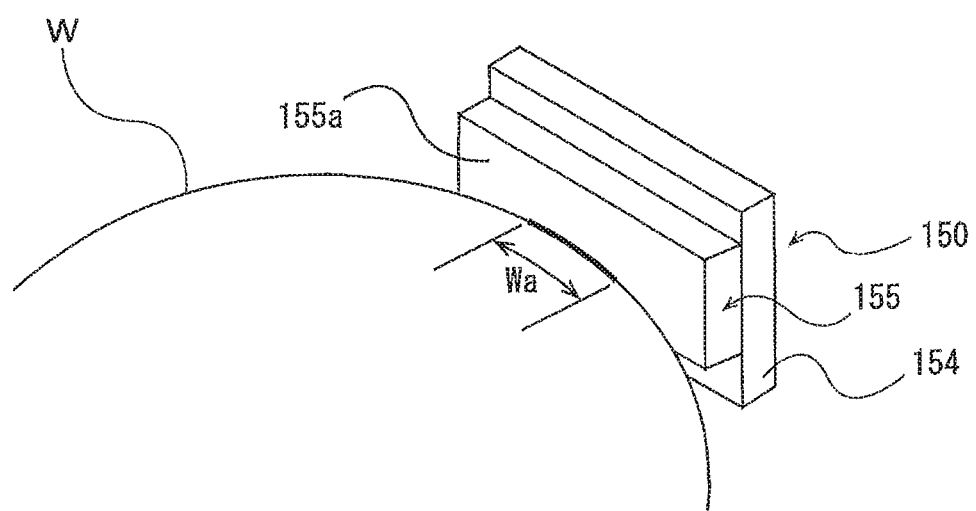
FIG. 26 is a schematic view showing the width of the pressing surface of the elastic member which is brought into contact with the bevel portion of the wafer through the polishing tape when the pressing surface of the elastic member of the pressing pad shown in FIG. 24 is perpendicular to a flat surface of the wafer.
Figure 27:
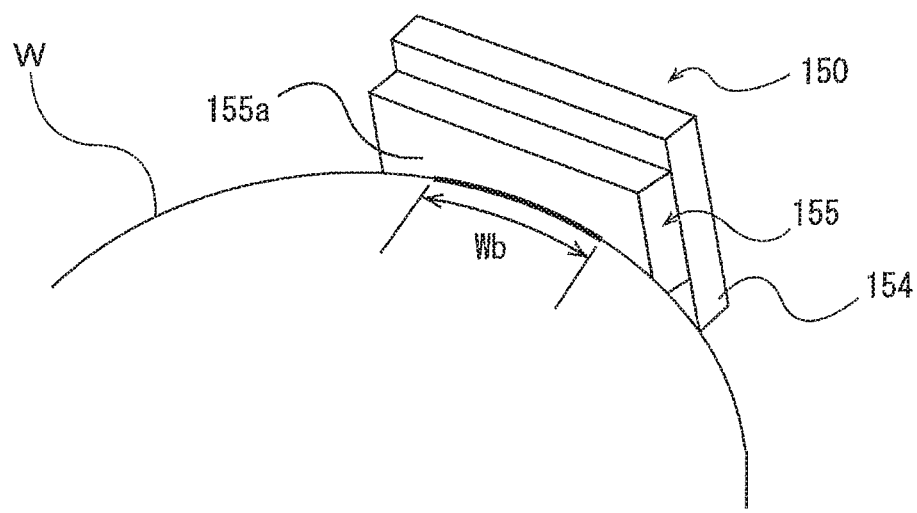
FIG. 27 is a schematic view showing the width of the pressing surface of the elastic member which is brought into contact with the bevel portion of the wafer through the polishing tape when the pressing surface of the elastic member of the pressing pad shown in FIG. 24 is inclined with respect to the flat surface of the wafer.
Figure 28:
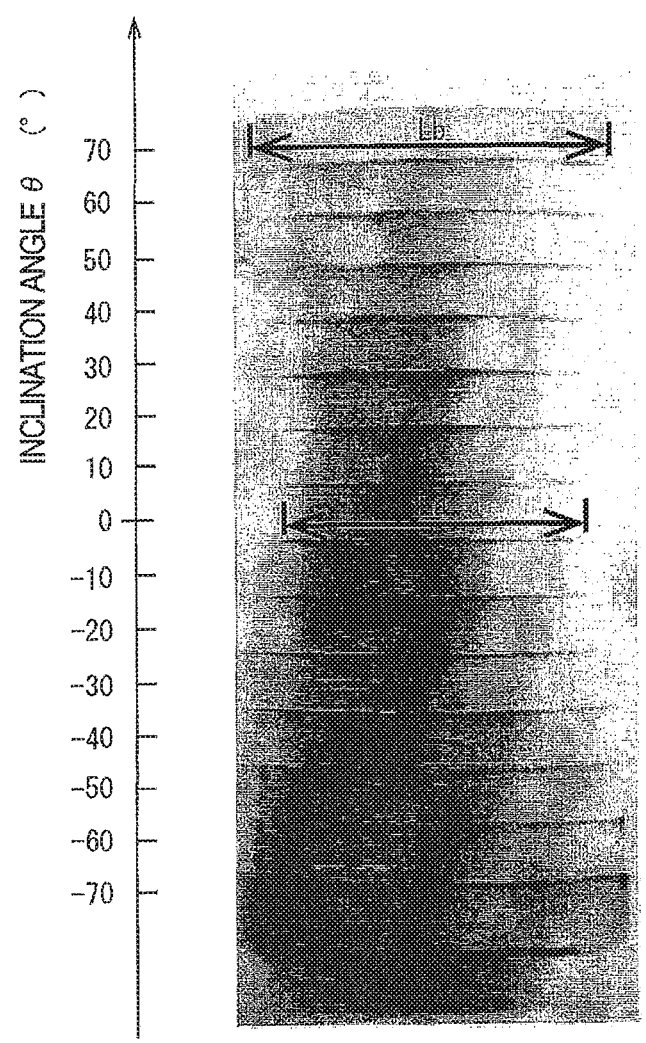
FIG. 28 is a photograph showing polishing impressions formed in the polishing tape when the bevel portion is polished by pressing the polishing tape against the bevel portion of the wafer with the pressing pad shown in FIG. 24.
Figure 29A:
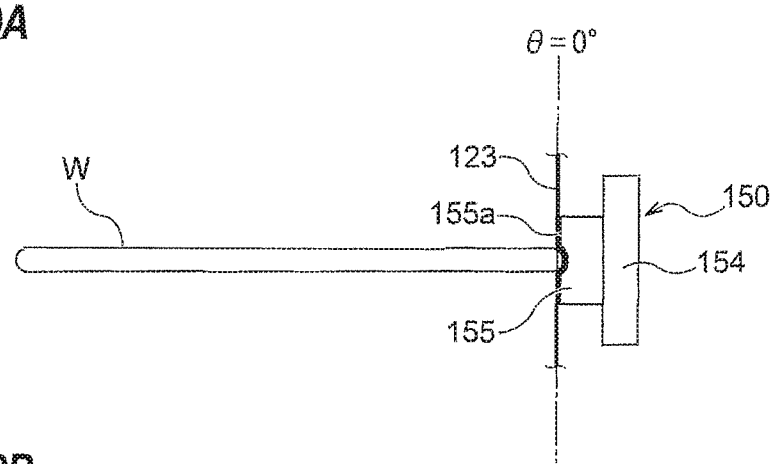
FIGS. 29A, 29B and 29C are schematic views showing the inclination angle of the pressing surface with respect to the flat surface of the wafer.
Figure 29B:
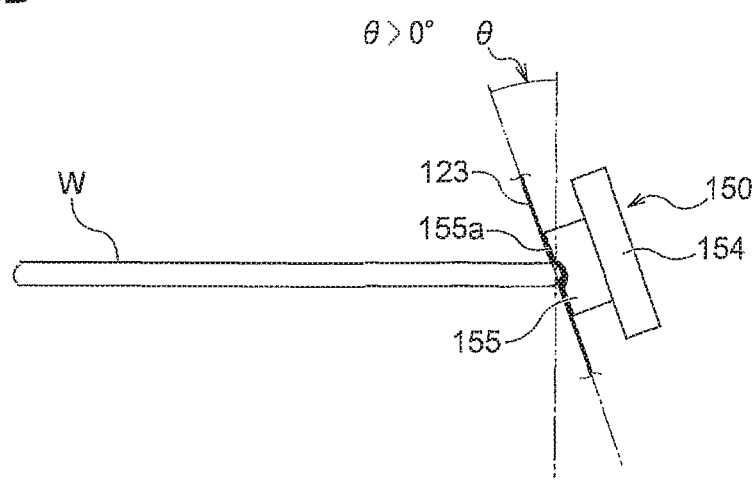
Figure 29C:
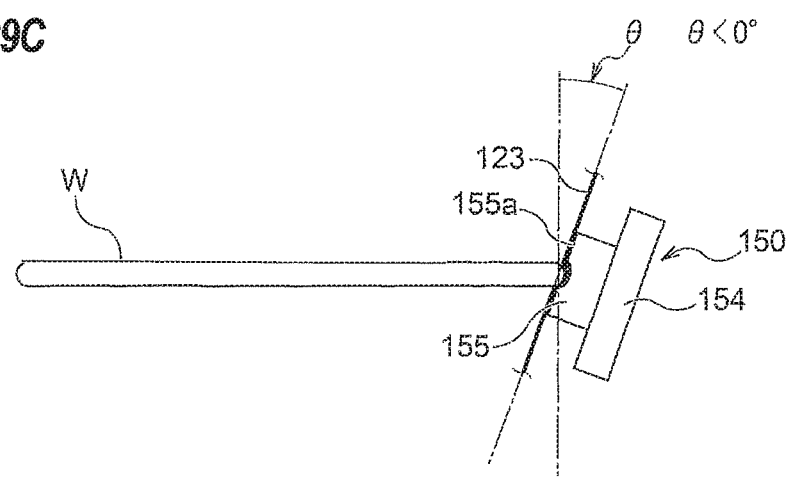
Figure 30:
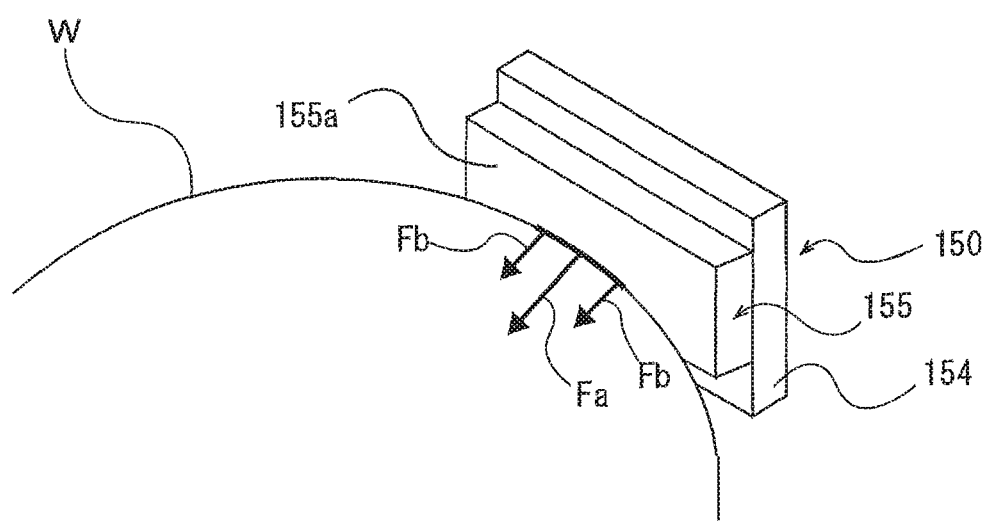
FIG. 30 is a schematic view showing pressing forces in a contact area between the bevel portion of the wafer and the polishing tape pressed by the pressing pad shown in FIG. 24.

As can be seen from the photograph shown in FIG. 17, the lengths of the polishing impressions are substantially the same in all of the inclination angles. For example, the length L1 of the polishing impression when the inclination angle θ is 0° is substantially equal to the length L2 of the polishing impression when the inclination angle θ is 70°. Thus, by using the pressing pad 50 according to the present embodiment, when the bevel portion B of the wafer W is polished by the polishing tape 23 while the polishing tape 23 is inclined with respect to the wafer W, the width of the polishing tape 23 which is brought into contact with the wafer W can be kept constant. As a result, even if the inclination angle θ of the pressing surface 55a is changed, the polishing rate is not changed, and thus the throughput of the polishing apparatus can be increased compared to the case where the bevel portion B of the wafer W is polished using the conventional pressing pad 150 (see FIG. 24).

Further, as can be seen from the photograph shown in FIG. 17, brightness of color at a central region of the polishing impression is substantially equal to brightness of color at an outer region of the polishing impression in all of the inclination angles θ. This means that as shown in FIGS. 15B and 16B, the central pressing force F1 in the contact area between the polishing tape 23 and the bevel portion B of the wafer W is substantially equal to the outer pressing force F2 in the contact area between the polishing tape 23 and the bevel portion B of the wafer W. Therefore, clogging of the polishing tape 23 at the central area of the polishing tape 23 hardly occurs compared to the case where the bevel portion B of the wafer W is polished using the conventional pressing pad 150 (see FIG. 24). As a result, the polishing rate of the bevel portion B of the wafer W is not lowered, and thus the throughput of the polishing apparatus can be increased.

The silicon sponge (elastic member) 55 according to the present embodiment has a plurality of fine voids therein, but has a solid structure in which the pressing surface 55a and the rear surface 55b of the silicon sponge 55 are integrally deformed. Specifically, an internal space configured to allow a deformation of only the pressing surface 55a of the silicon sponge 55 is not formed in the silicon sponge 55. Also in the case where the silicon sponge 55 has a hollow structure in which such internal space is formed, when the pressing pad 50 is pressed against the bevel portion B of the wafer W, the pressing surface 55a of the silicon sponge 55 can be curved along the circumferential direction of the wafer W. However, in this case, it is difficult to control the deformation amount of the pressing surface 55a of the silicon sponge 55. If the pressing surface 55a of the silicon sponge 55 is greatly deformed, the polishing tape 23 is brought into contact with the top edge portion E1 and/or the bottom edge portion E2 of the wafer W to damage the wafer W in some cases. Further, the central pressing force in the contact area between the polishing tape 23 and the bevel portion B of the wafer W becomes larger than the outer pressing force in the contact area between the polishing tape 23 and the bevel portion B of the wafer W, thus being liable to cause clogging of the polishing tape 23 at the central area of the polishing tape.

In the present embodiment, the both end portions 55c, 55d of the silicon sponge 55 having the solid structure are supported by the both end portions 58, 59 of the support member 56 having the recess 57. With this configuration, when the pressing pad 50 is pressed against the bevel portion B of the wafer W, the pressing surface 55a and the rear surface 55b of the silicon sponge 55 are integrally deformed, and thus the silicon sponge 55 can easily enter the recess 57. The silicon sponge 55 which has entered the recess 57 is deformed along the shape of the bevel portion B of the wafer W in a state where the rear surface 55b of the silicon sponge 55 is supported by the bottom surface 57a of the recess 57. Therefore, the deformation amount of the silicon sponge 55 can be controlled to a desired value by optimizing the shape of the recess 57 (e.g., the width of the recess 57, the depth of the recess 57, and the like) and the width Wd (see FIG. 9B) of the support area in the support member 56 based on the shape of the bevel portion of the wafer W, the width of the polishing tape 23, the force for pressing the polishing tape 23 against the wafer W, and the like. Further, as shown in FIGS. 15B and 16B, the central pressing force F1 in the contact area between the polishing tape 23 and the bevel portion B of the wafer W can be substantially equal to the outer pressing force F2 in the contact area between the polishing tape 23 and the bevel portion B of the wafer W.

Experiments for polishing bevel portions B of bare silicon wafers using the polishing head 30 having the above-described pressing pad 50 have been conducted. In the experiments, when the inclination angles of the polishing head 30 (i.e., inclination angles θ of the pressing surface 55a of the silicon sponge 55) were 0°, 70°, and −70°, polishing areas ($\mu m^2$) when the polishing tape 23 was pressed against the bevel portion B of the bare silicon wafer for predetermined time by the pressing pad 50 were measured. Further, plural experiments were conducted by changing the width Wd (see FIG. 9B) of the support area and the depth Dp (see FIG. 9B) of the recess 57 in the support member 56. Further, as comparative examples, polishing areas ($\mu m^2$) when the polishing tape 23 was pressed against the bevel portion B of the bare silicon wafer by the conventional pressing pad 150 (see FIG. 24) were measured under the same conditions. TABLE 1 shows experimental results when the inclination angle of the polishing head 30 was 0°, TABLE 2 shows experimental results when the inclination angle of the polishing head 30 was 70°, and TABLE 3 shows experimental results when the inclination angle of the polishing head 30 was −70°.

referred to as an SiN wafer. In other experiments, the polishing head 30 having the pressing pad 50 was intermittently tilted, the time required for polishing the silicon nitride film of the SiN wafer by 200 nm in each angle was measured. Further, plural other experiments were conducted

TABLE 1

| | | WIDTH Wd (mm) | | | | |
|---|---|---|---|---|---|---|
| INCLINATION ANGLE (0°) | | 0.0 (COMPARATIVE EXAMPLE) | 1.0 | 3.0 | 5.0 | 7.0 |
| DEPTH Dp (mm) | 1.5 | | | 4804.8 | 5221.3 | |
| | 1.0 | | | 4869.0 | 5366.2 | |
| | 0.5 | | 4657.6 | 5306.0 | 5461.9 | 5309.2 |
| | 0.3 | | | 4759.1 | | |
| | 0.0 (COMPARATIVE EXAMPLE) | 4596.2 | | | | |

TABLE 2

| | | WIDTH Wd (mm) | | | | |
|---|---|---|---|---|---|---|
| INCLINATION ANGLE (70°) | | 0.0 (COMPARATIVE EXAMPLE) | 1.0 | 3.0 | 5.0 | 7.0 |
| DEPTH Dp (mm) | 1.5 | | | 3597.7 | 3500.7 | |
| | 1.0 | | | 3623.9 | 3862.0 | |
| | 0.5 | | 3897.0 | 4177.5 | 4138.3 | 3828.1 |
| | 0.3 | | | 3922.6 | | |
| | 0.0 (COMPARATIVE EXAMPLE) | 3799.5 | | | | |

TABLE 3

| | | WIDTH Wd (mm) | | | | |
|---|---|---|---|---|---|---|
| INCLINATION ANGLE (−70°) | | 0.0 (COMPARATIVE EXAMPLE) | 1.0 | 3.0 | 5.0 | 7.0 |
| DEPTH Dp (mm) | 1.5 | | | 4322.9 | 4703.1 | |
| | 1.0 | | | 4651.9 | 5007.1 | |
| | 0.5 | | 4207.8 | 4659.0 | 5016.8 | 4617.4 |
| | 0.3 | | | 4499.2 | | |
| | 0.0 (COMPARATIVE EXAMPLE) | 4457.5 | | | | |

As can be seen from TABLE 1 to TABLE 3, the polishing area of the bare silicon wafer which has been polished using the above-described pressing pad 50 is larger than the polishing area of the bare silicon wafer which has been polished using the conventional pressing pad 150. Therefore, the bare silicon wafer W can be polished efficiently by using the pressing pad 50 according to the present embodiments. Further, TABLE 1 to TABLE 3 show that when the width Wd of the support area in the support member 56 is 3 mm or 5 mm and the depth Dp of the recess 57 is 0.5 mm, the polishing area increases greatly.

Further, other experiments for polishing the entire bevel portions of the wafers having silicon nitride films deposited on the bare silicon wafers using the polishing head 30 having the above-described pressing pad 50 have been conducted. For the purpose of the explanation, the wafer W having a silicon nitride film deposited on the bare silicon wafer is by changing the width Wd of the support area and the depth Dp of the recess 57 (see FIG. 9B) in the support member 56. Furthermore, as comparative examples, the polishing head 30 having the conventional pressing pad 150 (see FIG. 24) was intermittently tilted, and the time required for polishing the silicon nitride film of the SiN wafer by 200 nm in each angle was measured.

Figure 18:
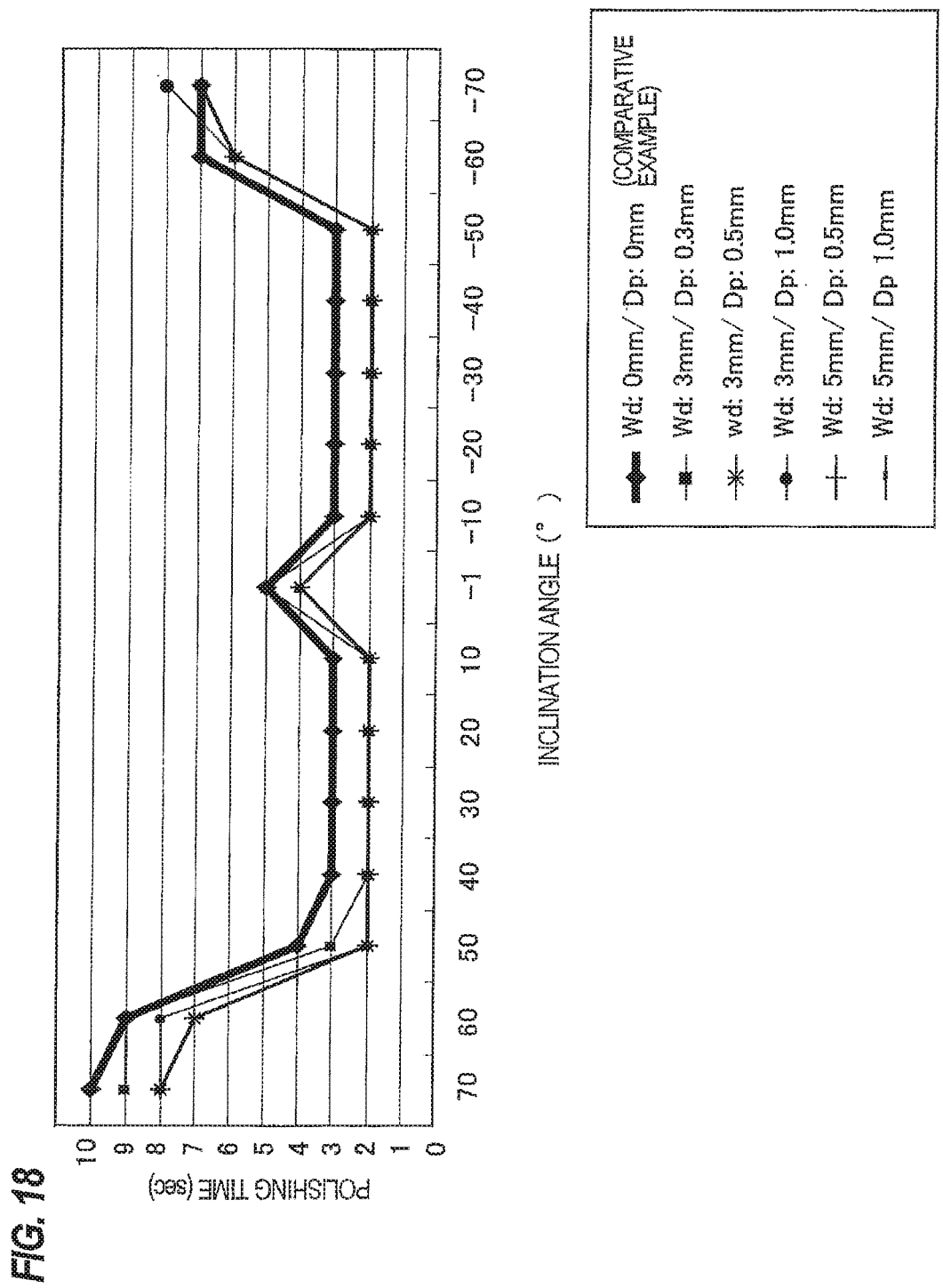
FIG. 18 is a graph showing other experimental results.

Other experimental results are shown in a graph of FIG. 18. In the graph shown in FIG. 18, the vertical axis represents the time required for polishing the silicon nitride film by 200 nm, and the horizontal axis represents inclination angles of the polishing head 30. In the graph shown in FIG. 18, the results obtained by the polishing head 30 having the conventional pressing pad 150 as comparative examples are shown by a bold solid line.

As can be seen from the graph shown in FIG. 18, the polishing time of the silicon nitride film by the polishing head 30 having the pressing pad 50 according to the present embodiment is shorter than the polishing time of the silicon nitride film by the polishing head 30 having the conventional pressing pad 150. In particular, when the pressing pad 50 in which the depth Dp of the recess 57 of the support member 56 is 0.5 mm is used, the polishing time of the silicon nitride film can be reduced greatly. More specifically, when the polishing head 30 having the conventional pressing pad 150 is used, the polishing time of the silicon nitride film in the entire bevel portion of the SiN wafer is 69 seconds. In contrast, when the polishing head 30 having the pressing pad 50 in which the depth Dp of the recess 57 of the support member 56 is 0.5 mm is used, the polishing time of the silicon nitride film in the entire bevel portion of the SiN wafer is 52 seconds. Therefore, the polishing time when the silicon nitride film is polished by the polishing head 30 having the above-described pressing pad 50 is shorter than the polishing time when the silicon nitride film is polished by the polishing head 130 having the conventional pressing pad 150 by about 25%.

Figure 19:
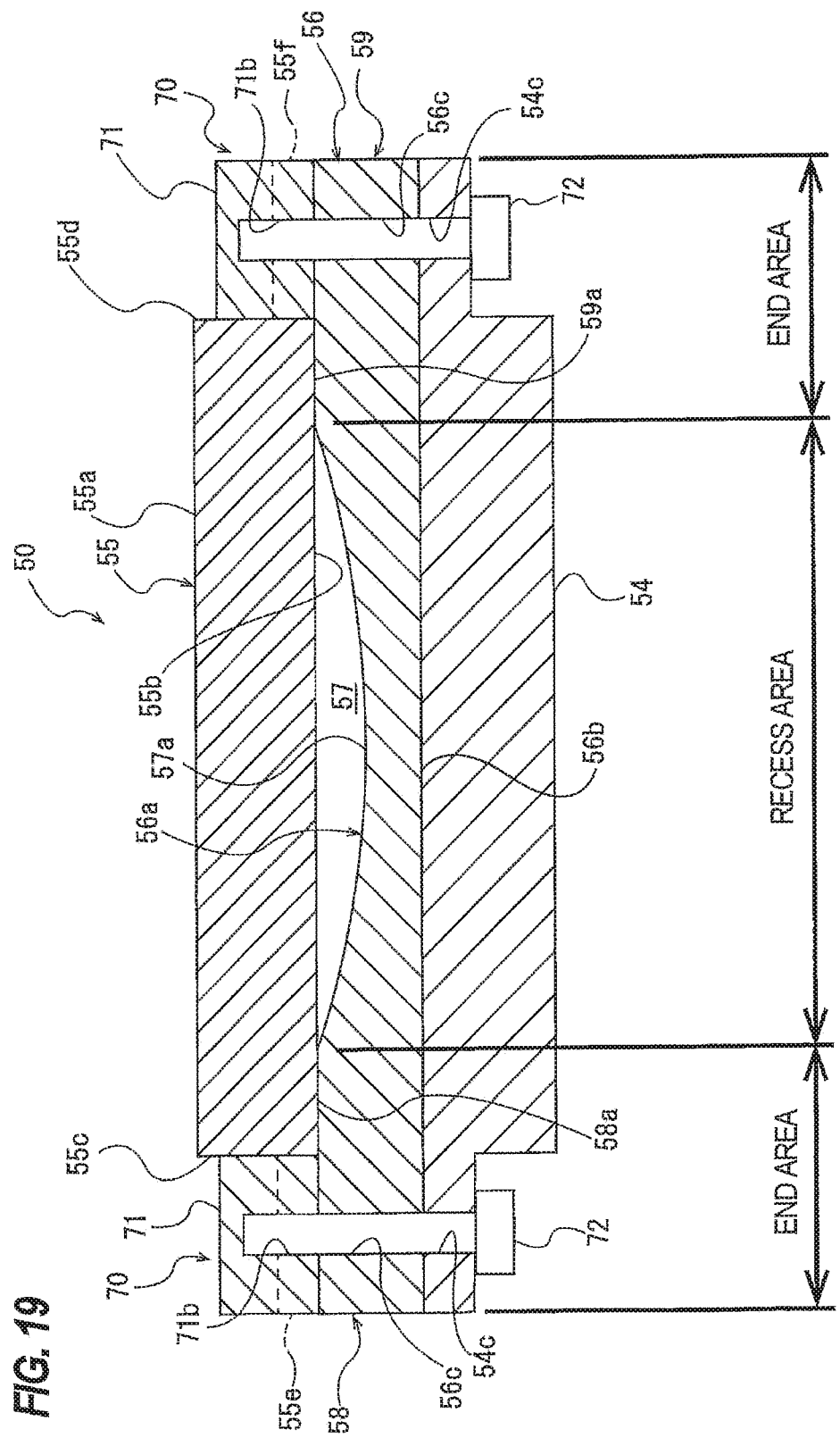
FIG. 19 is a cross-sectional view showing a pressing pad according to another embodiment.

FIG. 19 is a cross-sectional view showing a pressing pad 50 according to another embodiment. The configuration of the present embodiment which will not be particularly described is the same as that of the embodiment described with reference to FIGS. 4 to 10, and will not be described in duplication. The recess 57 of the pressing pad 50 shown in FIG. 19 has a curved bottom surface 57a. More specifically, the bottom surface 57a of the recess 57 has a shape curved into a circular arc. In the present embodiment, the bottom surface 57a of the recess 57 is directly coupled to the front surfaces 58a, 59a of the both end portions 58, 59 of the support member 56. Specifically, the recess 57 according to the present embodiment has no side surfaces 57b, 57c of the recess 57 shown in FIGS. 9A and 9B. In one embodiment, the curved bottom surface 58a may be coupled to the front surfaces 58a, 59a of the both end portions 58, 59 of the support member 56 through the side surfaces 58b, 58c of the recess 57.

The silicon sponge 55 can enter the recess 57 having the curved bottom surface 58a. The rear surface 55b of the silicon sponge 55 which has entered the recess 57 of the support member 56 is brought into contact with the curved bottom surface 57a of the recess 57, and the silicon sponge 55 is deformed into a shape along the bevel portion B of the wafer W. Therefore, when the bevel portion B of the wafer W is polished while the polishing tape 23 is inclined with respect to the wafer W, the width of the polishing tape 23 which is brought into contact with the wafer W can be kept constant. Further, the pressing force in the contact area between the polishing tape 23 and the bevel portion B of the wafer W can be uniformized. It is preferable that the bottom surface 57a of the recess 57 has a circular arc shape having a radius of curvature substantially equal to a radius of curvature of the bevel portion of the wafer W. In this case, when the rear surface 55b of the silicon sponge 55 which has entered the recess 57 of the support member 56 is brought into contact with the curved bottom surface 57a of the recess 57, the silicon sponge 55 is deformed into the same shape as the bevel portion B along the circumferential direction of the wafer W.

Figure 20:
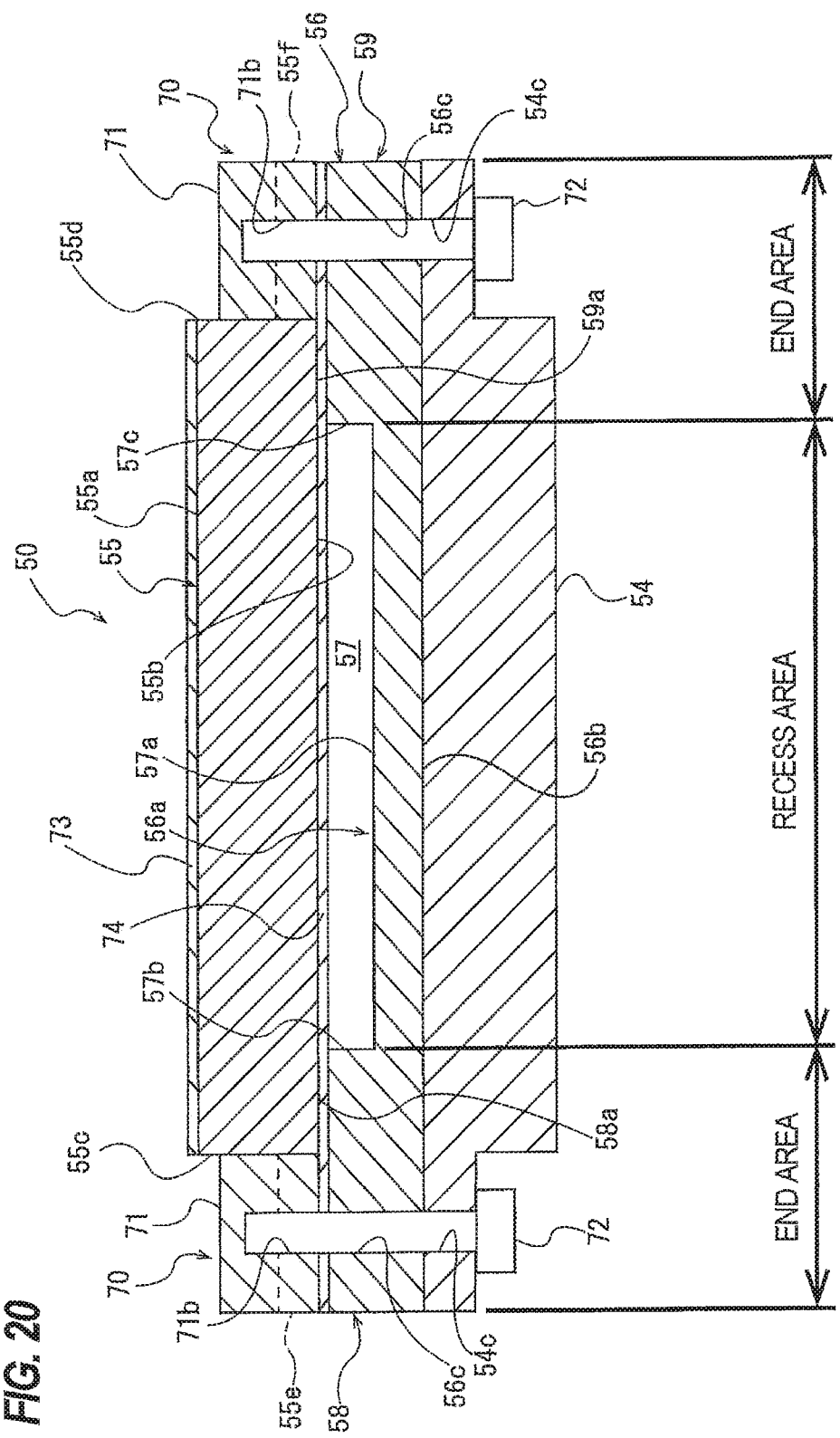
FIG. 20 is a cross-sectional view of a pressing pad according to still another embodiment.

FIG. 20 is a cross-sectional view of a pressing pad 50 according to still another embodiment. The configuration of the present embodiment which will not be particularly described is the same as that of the embodiment described with reference to FIGS. 4 to 10, and will not be described in duplication. The pressing pad 50 shown in FIG. 20 has a sheet 73 attached to the pressing surface 55a of the silicon sponge 55 to reduce a friction against the rear surface of the polishing tape 23. The sheet 73 has a surface to which treatment for reducing a friction coefficient such as Teflon (registered trademark) coating is applied, and this surface is brought into contact with the rear surface of the polishing tape 23. Further, in the present embodiment, a sheet 74 having the same structure as the sheet 73 is attached to the rear surface 55b of the silicon sponge 55.

Because the sheets 73, 74 having the same structure are attached to the pressing surface 55a and the rear surface 55b of the silicon sponge 55, respectively, when the pressing surface 55a of the silicon sponge 55 presses the bevel portion B of the wafer W and is thus deformed, the rear surface 55b of the silicon sponge 55 can be deformed in response to the deformation of the pressing surface 55a of the silicon sponge 55. Specifically, the silicon sponge 55 can enter the recess 57 properly, and thus the silicon sponge 55 can be deformed in a shape along the bevel portion B of the wafer W. As a result, even if the sheet 73 is attached to the pressing surface 55a of the silicon sponge 55, the width of the polishing tape 23 which is brought into contact with the wafer W can be kept constant when the bevel portion B of the wafer W is polished by the polishing tape 23 while the polishing tape 23 is inclined with respect to the wafer W. Further, the pressing force in the contact area between the polishing tape 23 and the bevel portion B of the wafer W can be uniformized.

Figure 21:
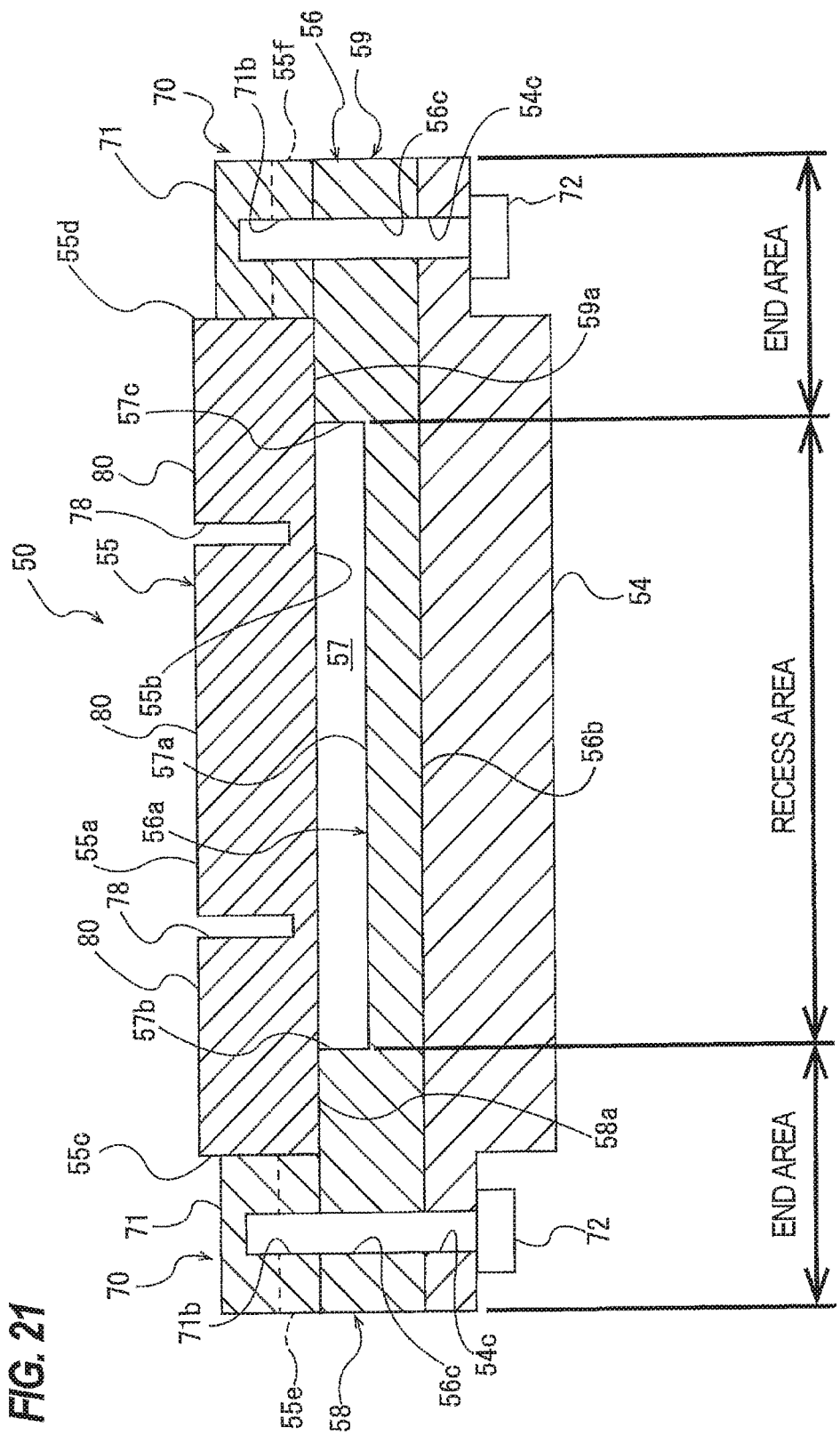
FIG. 21 is a cross-sectional view of a pressing pad according to still another embodiment.

FIG. 21 is a cross-sectional view of a pressing pad 50 according to still another embodiment. The configuration of the present embodiment which will not be particularly described is the same as that of the embodiment described with reference to FIGS. 4 to 10, and will not be described in duplication. A plurality of grooves (two grooves in FIG. 21) 78 extending from the pressing surface 55a toward the rear surface 55b are formed in the pressing surface 55a of the silicon sponge 55 of the pressing pad 50 shown in FIG. 21. These grooves 78 are parallel to each other and are arranged at a regular interval. Because the plural grooves 78 are formed in the pressing surface 55a of the silicon sponge 55, a plurality of block bodies (three block bodies in FIG. 21) 80 are formed in the silicon sponge 55. In the present embodiment, the pressing surface 55a of the silicon sponge 55 comprises front surfaces of the plural block bodies 80.

By using the silicon sponge 55 in which the plural block bodies 80 are formed, the silicon sponge 55 is liable to be deformed into a shape along the bevel portion B of the wafer W. As a result, the width of the polishing tape 23 which is brought into contact with the wafer W can be kept constant when the bevel portion B of the wafer W is polished by the polishing tape 23 while the polishing tape 23 is inclined with respect to the wafer W. Further, the pressing force in the contact area between the polishing tape 23 and the bevel portion B of the wafer W can be uniformized.

Figure 22:
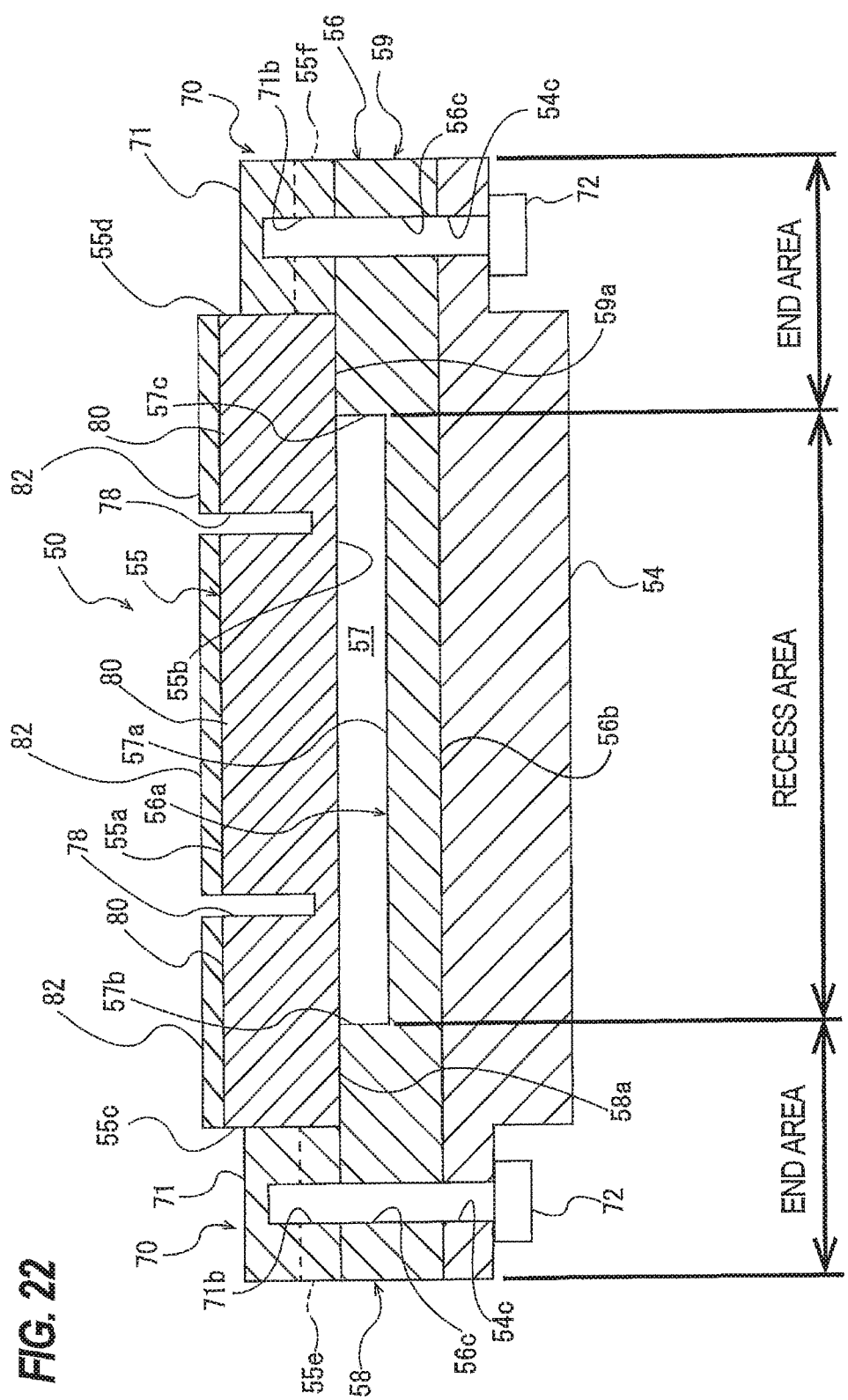
FIG. 22 is a cross-sectional view of a pressing pad according to still another embodiment.
Figure 23A:
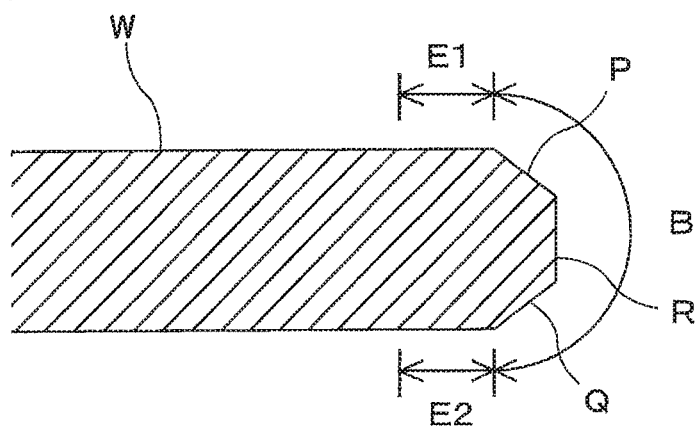
FIG. 23A and FIG. 23B are enlarged cross-sectional views each showing a peripheral portion of a substrate.
Figure 23B:
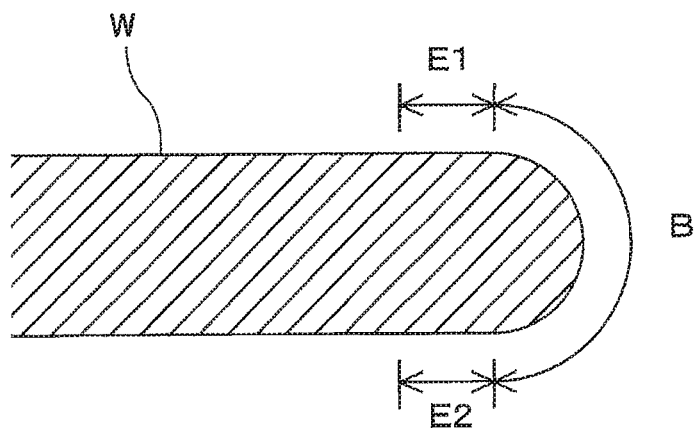

FIG. 22 is a cross-sectional view of a pressing pad 50 according to still another embodiment. The configuration of the present embodiment which will not be particularly described is the same as that of the embodiment described with reference to FIG. 21, and will not be described in duplication. A plurality of grooves 78 extending from the pressing surface 55a toward the rear surface 55b are formed also in the silicon sponge 55 of the pressing pad 50 shown in FIG. 22. Therefore, a plurality of block bodies 80 are formed in the silicon sponge 55 of the pressing pad 50 shown in FIG. 22.

Whetstones 82 are attached respectively to the front surfaces of the plural block bodies 80 of the silicon sponge 55 shown in FIG. 22. The whetstone 82 constitutes a polishing tool for polishing the bevel portion B of the wafer W. Specifically, in the present embodiment, the whetstone 82 is used as the polishing tool in place of the polishing tape 23. Therefore, by using the pressing pad 50 shown in FIG. 22, the above-described polishing-tape supply mechanisms 2A to 2D become unnecessary, and thus the polishing apparatus can be compact and can be manufactured at a low cost.

Also in the case where the bevel portion B of the wafer W is polished using the polishing head 30 having the pressing pad 50 according to the present embodiment, the silicon sponge 55 is deformed into a shape along the bevel portion B of the wafer W. As a result, the width of the polishing tape 23 which is brought into contact with the wafer W can be kept constant when the bevel portion B of the wafer W is polished by the whetstones 82 while the whetstones 82 are inclined with respect to the wafer W. Further, the pressing force in the contact area between the whetstones 82 and the bevel portion B of the wafer W can be uniformized.

The present invention is not limited to the above-described embodiments. For example, in the embodiments shown in FIGS. 20 to 22, the bottom surface 57a of the recess 57 may have a curved shape shown in FIG. 19. Further, the whetstone 82 shown in FIG. 22 may be attached to the pressing surface 55a of the silicon sponge 55 shown in FIG. 7 or FIG. 19. In this case, the whetstone 82 may be attached to the entire pressing surface 55a or only to a part of the pressing surface 55a. For example, the whetstone 82 is attached only to a part of the pressing surface 55a deformed when the pressing pad 50 is pressed against the bevel portion B of the substrate.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

What is claimed is:

1. A polishing apparatus comprising:
   a substrate holder configured to hold a substrate and to rotate the substrate; and
   a pressing pad configured to press a polishing tool against a peripheral portion of the substrate held by the substrate holder;
   wherein the pressing pad comprises:
   an elastic member having a pressing surface configured to press the polishing tool against the peripheral portion of the substrate;
   a support member configured to support the elastic member; and
   fixing means configured to fix both end portions of the elastic member to the support member, respectively;
   wherein the support member has a recess formed in a front surface of the support member, the elastic member being capable of entering the recess,
   the elastic member has fixing projections projecting from both side surfaces of the elastic member, respectively, and
   each of the fixing means includes a fixing block having a step portion with which the fixing projection is fitted.

2. The polishing apparatus according to claim 1, wherein a bottom surface of the recess is curved.

3. A polishing apparatus comprising:
   a substrate holder configured to hold a substrate and to rotate the substrate; and
   a pressing pad configured to press a polishing tool against a peripheral portion of the substrate held by the substrate holder;
   wherein the pressing pad comprises:
   an elastic member having a pressing surface configured to press the polishing tool against the peripheral portion of the substrate; and
   a support member configured to support the elastic member;
   wherein the support member has a recess formed in a front surface of the support member, the elastic member being capable of entering the recess, and
   wherein a sheet is attached to a rear surface on the opposite side of the pressing surface of the elastic member.

4. The polishing apparatus according to claim 1, wherein the polishing tool comprises a polishing tape.

5. A polishing apparatus comprising:
   a substrate holder configured to hold a substrate and to rotate the substrate; and
   a pressing pad configured to press a polishing tool against a peripheral portion of the substrate held by the substrate holder;
   wherein the pressing pad comprises:
   an elastic member having a pressing surface configured to press the polishing tool against the peripheral portion of the substrate; and
   a support member configured to support the elastic member;
   wherein the support member has a recess formed in a front surface of the support member, the elastic member being capable of entering the recess, and
   wherein a groove extending toward a rear surface on the opposite side of the pressing surface is formed in the pressing surface of the elastic member; and
   the elastic member has block bodies divided by the groove.

6. The polishing apparatus according to claim 5, wherein the polishing tool comprises a whetstone attached to a front surface of the block body.

7. A pressing pad for pressing a polishing tool configured to polish a peripheral portion of a substrate against the peripheral portion of the substrate, comprising:
   an elastic member having a pressing surface configured to press the polishing tool against the peripheral portion of the substrate;
   a support member configured to support the elastic member; and
   fixing means configured to fix both end portions of the elastic member to the support member, respectively;
   wherein the support member has a recess formed in a front surface of the support member, the elastic member being capable of entering the recess,
   the elastic member has fixing projections projecting from both side surfaces of the elastic member, respectively, and
   each of the fixing means includes a fixing block having a step portion with which the fixing projection is fitted.

8. The pressing pad according to claim 7, wherein a bottom surface of the recess is curved.

9. A pressing pad for pressing a polishing tool configured to polish a peripheral portion of a substrate against the peripheral portion of the substrate, comprising:

an elastic member having a pressing surface configured to press the polishing tool against the peripheral portion of the substrate; and a support member configured to support the elastic member;

wherein the support member has a recess formed in a front surface of the support member, the elastic member being capable of entering the recess, and wherein a sheet is attached to a rear surface on the opposite side of the pressing surface of the elastic member.

10. The pressing pad according to claim 7, wherein the polishing tool comprises a polishing tape.

11. A pressing pad for pressing a polishing tool configured to polish a peripheral portion of a substrate against the peripheral portion of the substrate, comprising:

an elastic member having a pressing surface configured to press the polishing tool against the peripheral portion of the substrate; and a support member configured to support the elastic member;

wherein the support member has a recess formed in a front surface of the support member, the elastic member being capable of entering the recess, and wherein a groove extending toward a rear surface on the opposite side of the pressing surface is formed in the pressing surface of the elastic member; and the elastic member has block bodies divided by the groove.

12. The pressing pad according to claim 11, wherein a whetstone used as the polishing tool is attached to the front surface of the block body.

13. The polishing apparatus according to claim 1, wherein the fixing means further includes a screw screwed into the fixing block.

14. The pressing pad according to claim 7, wherein the fixing means further includes a screw screwed into the fixing block.

* * * * *